(12) United States Patent  (10) Patent No.: US 12,167,630 B2
Sano et al.  (45) Date of Patent: Dec. 10, 2024

(54) APPARATUS COMPRISING EMISSION AREAS WITH DIFFERENT RELATIVE POSITIONING OF CORRESPONDING LENSES

(71) Applicant: CANON KABUSHIKI KAISHA, Tokyo (JP)

(72) Inventors: Hiroaki Sano, Kanagawa (JP); Shoma Hinata, Kanagawa (JP); Yojiro Matsuda, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 373 days.

(21) Appl. No.: 17/581,419

(22) Filed: Jan. 21, 2022

(65) Prior Publication Data

US 2022/0238845 A1 Jul. 28, 2022

(30) Foreign Application Priority Data

Jan. 27, 2021 (JP) ................. 2021-011299

(51) Int. Cl.
*H10K 50/858* (2023.01)
*H10K 59/121* (2023.01)
*H10K 59/65* (2023.01)

(52) U.S. Cl.
CPC ......... *H10K 50/858* (2023.02); *H10K 59/121* (2023.02); *H10K 59/65* (2023.02)

(58) Field of Classification Search
None
See application file for complete search history.

(56) References Cited

U.S. PATENT DOCUMENTS

| | | | |
|---|---|---|---|
| 2015/0070552 A1* | 3/2015 | Lin | H01L 27/14627 348/307 |
| 2020/0358034 A1* | 11/2020 | Koshihara | H10K 50/858 |
| 2021/0057678 A1* | 2/2021 | Motoyama | H10K 59/38 |
| 2022/0209197 A1* | 6/2022 | Luo | H10K 59/38 |

FOREIGN PATENT DOCUMENTS

| | | |
|---|---|---|
| CN | 111682122 A | 9/2020 |
| JP | 2008178046 A | 7/2008 |
| JP | 2016152381 A | 8/2016 |
| JP | 2017017013 A | 1/2017 |
| JP | 2020184480 A | 11/2020 |
| KR | 20200042981 A | 4/2020 |
| WO | 2017169563 A1 | 10/2017 |

* cited by examiner

*Primary Examiner* — Nduka E Ojeh

(74) *Attorney, Agent, or Firm* — Canon U.S.A., Inc. IP Division

(57) ABSTRACT

The present disclosure provides an apparatus including a substrate including a surface, first to fourth elements that emit first light or second light, and first to fourth lenses, in which the relationship between the size of the emission area and the relative position of the lenses differs between the first light and the second light so that color misregistration due to the viewing angle is reduced.

26 Claims, 14 Drawing Sheets

APPARATUS COMPRISING EMISSION AREAS WITH DIFFERENT RELATIVE POSITIONING OF CORRESPONDING LENSES

BACKGROUND OF THE INVENTION

Field of the Invention

The aspect of the embodiments relates to an apparatus including an optical member, such as a microlens, a display apparatus, an image capturing apparatus, and an electronic apparatus.

Description of the Related Art

Organic light emitting elements include a first electrode, a second electrode, and an organic compound layer disposed therebetween. Organic light emitting elements emit light when carriers are injected from the first electrode and the second electrode. Organic light emitting elements are lightweight and flexible. For this reason, display apparatuses including the organic light emitting elements are attracting attention. For high-definition display apparatuses, a method using an organic white light emitting element and color filters (hereinafter referred to as "white+CF method") is known. The white+CF method forms an organic layer over the entire surface of the substrate and is therefore easier to achieve high definition of pixel size and pixel pitch than a method of forming organic layers for individual colors using a metal mask.

International Publication No. WO 2017/169563 (hereinafter referred to as PTL 1) discloses use of a display apparatus including organic light emitting elements together with an optical system.

Organic light emitting elements in the peripheral area use light rays emitted at wide angles. This requires to improve the viewing angle characteristics of the organic light emitting elements. PTL 1 describes a display apparatus whose viewing angle characteristics are improved by displacing the center of the light emitting surface of the light emitting portion and the center of the color filter from each other.

Japanese Patent Laid-Open No. 2017-017013 (hereinafter referred to as PTL 2) discloses a display apparatus including an outcoupling component that reduces total reflection and extracts light with a wide viewing angle.

The display apparatuses described in PTLs 1 and 2 can use light with a wide viewing angle.

However, of the light with a wide viewing angle emitted by the organic light emitting element, the proportion of light contributing to display is small, and provision for chromaticity misalignment changes according to the wavelength of extracted light. For these reasons, there is room for improvement in the position of the lens and the size of the emission area.

SUMMARY OF THE INVENTION

An apparatus according to an aspect of the embodiments includes a substrate including a surface, a first element, a second element, a third element, a fourth element, the first to fourth elements being disposed on the surface, a first lens that receives light emitted from the first element, a second lens that receives light emitted from the second element, a third lens that receives light emitted from the third element, and a fourth lens that receives light emitted from the fourth element, wherein the first element and the second element emit first light, and the third element and the fourth element emit second light that differs in wavelength from the first light, wherein, in a cross section perpendicular to the surface, a distance between a middle point of an emission area of the second element and an apex of the second lens in a direction parallel to the surface is larger than a distance between a middle point of an emission area of the first element and an apex of the first lens in the direction parallel to the surface, wherein a distance between a middle point of an emission area of the fourth element and an apex of the fourth lens in the direction parallel to the surface is larger than a distance between a middle point of an emission area of the third element and an apex of the third lens in the direction parallel to the surface, wherein a difference between the distance between the middle point of the emission area of the second element and the apex of the second lens in the direction parallel to the surface and the distance between the middle point of the emission area of the first element and the apex of the first lens in the direction parallel to the surface is equal to or less than a difference between the distance between the middle point of the emission area of the fourth element and the apex of the fourth lens in the direction parallel to the surface and the distance between the middle point of the emission area of the third element and the apex of the third lens in the direction parallel to the surface, wherein the emission area of the second element is equal to or smaller than the emission area of the first element, wherein the emission area of the fourth element is smaller than the emission area of the third element, and wherein a difference in size between the emission area of the second element and the emission area of the first element is equal to or less than a difference in size between the emission area of the fourth element and the emission area of the third element.

Further features of the disclosure will become apparent from the following description of exemplary embodiments with reference to the attached drawings.

DESCRIPTION OF THE EMBODIMENTS

Figure 1A:
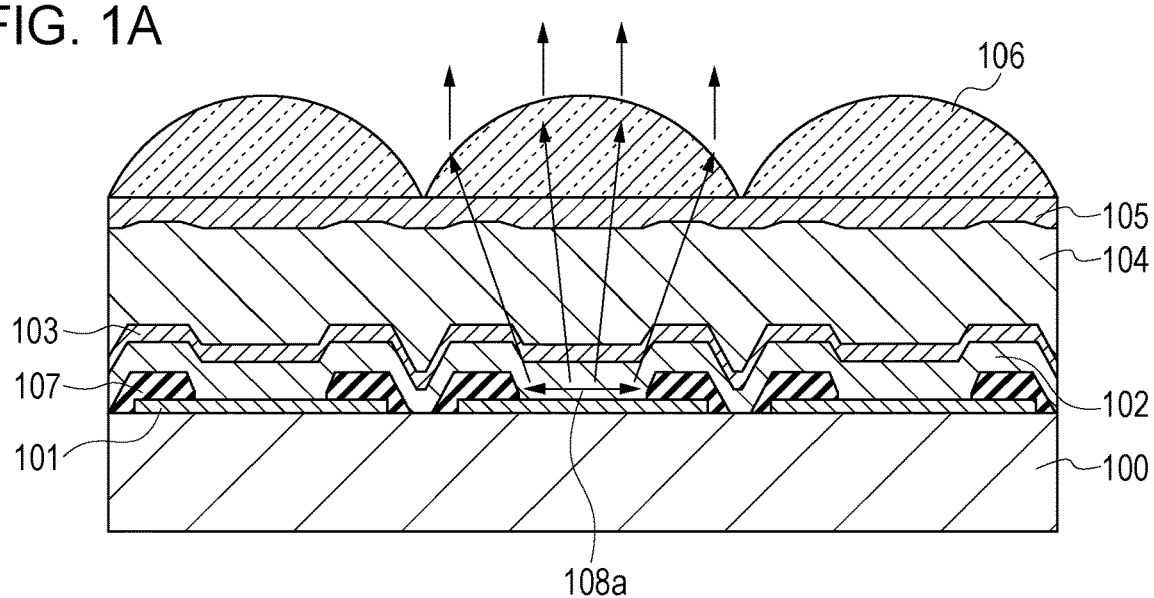
FIG. 1A is a cross-sectional view of first light emitting elements of a light emitting apparatus according to an embodiment of the present disclosure.

A light emitting apparatus according to an embodiment of the present disclosure includes a substrate including a principal surface, a first light emitting element, a second light emitting element, a third light emitting element, a fourth light emitting element, the first to fourth light emitting elements being disposed on the principal surface, a first lens that receives light emitted from the first light emitting element, a second lens that receives light emitted from the second light emitting element, a third lens that receives light emitted from the third light emitting element, and a fourth lens that receives light emitted from the fourth light emitting element, wherein the first light emitting element and the second light emitting element emit first light, and the third light emitting element and the fourth light emitting element emit second light that differs in wavelength from the first light,
wherein, in a cross section perpendicular to the principal surface, a distance between a middle point of an emission area of the second light emitting element and an apex of the second lens in a direction parallel to the principal surface is larger than a distance between a middle point of an emission area of the first light emitting element and an apex of the first lens in the direction parallel to the principal surface, wherein a distance between a middle point of an emission area of the fourth light emitting element and an apex of the fourth lens in the direction parallel to the principal surface is larger than a distance between a middle point of an emission area of the third light emitting element and an apex of the third lens in the direction parallel to the principal surface, wherein a difference between the distance between the middle point of the emission area of the second light emitting element and the apex of the second lens in the direction parallel to the principal surface and the distance between the middle point of the emission area of the first light emitting element and the apex of the first lens in the direction parallel to the principal surface is equal to or less than a difference between the distance between the middle point of the emission area of the fourth light emitting element and the apex of the fourth lens in the direction parallel to the principal surface and the distance between the middle point of the emission area of the third light emitting element and the apex of the third lens in the direction parallel to the principal surface, wherein the emission area of the second light emitting element is equal to or smaller than the emission area of the first light emitting element, wherein the emission area of the fourth light emitting element is smaller than the emission area of the third light emitting element, and wherein a difference in size between the emission area of the second light emitting element and the emission area of the first light emitting element is equal to or less than a difference in size between the emission area of the fourth light emitting element and the emission area of the third light emitting element.

The emission area of the second light emitting element may be smaller than the emission area of the first light emitting element. The emission area of the fourth light emitting element may be smaller than the emission area of the third light emitting element. The emission area of the fourth light emitting element may be smaller than the emission area of the second light emitting element.

The second light emitting element and the fourth light emitting element may be light emitting elements that emit light at wide angles to the display apparatus. In the second light emitting element and the fourth light emitting element, the lenses are displaced to emit wide-angle light as compared with the first light emitting element and the third light emitting element.

In this case, the proportion of the light of the second light emitting element and the fourth light emitting element contributing to the light emission of the display apparatus is smaller than that of the first light emitting element and the third light emitting element. This is because, although the whole of the light emitted from the first light emitting element and the third light emitting element contributes to the light emission of the display apparatus, only part of the light emitted from the second light emitting element and the fourth light emitting element contributes to the light emission of the display apparatus.

To reduce electric power for light emission that does not contribute to the light emission in the second light emitting element and the fourth light emitting element, the emission areas of the second light emitting element and the fourth light emitting element are smaller than those of the first light emitting element and the third light emitting element. The amount of light emitted from the light emitting elements decreases as the emission areas decreases, but the proportion of contribution to the light emission of the display apparatus increases. As a result, the power consumption of the display apparatus is reduced. If the emission area of the fourth light emitting element is smaller than the emission area of the third light emitting element, the emission area of the first light emitting element and the emission area of the second light emitting element may be the same. This is because the emission area of the fourth light emitting element is smaller than the emission area of the third light emitting element, reducing the power consumption.

The first light emitting element and the second light emitting element emit first light. The third light emitting element and the fourth light emitting element emit second light that differs in wavelength from the first light. Because of the difference in wavelength, the difference between the sizes of the emission areas of the first and second light emitting elements and the difference between the sizes of the emission areas of the third and fourth light emitting elements differ. The wavelength of the first light may be shorter than the wavelength of the second light. The first light may be blue, and the second light may be green.

The amount of light from the second light emitting element entering the second lens may be smaller than the amount of light from the first light emitting element entering the first lens. In other words, the lens efficiency of the second lens is lower than the lens efficiency of the first lens. The lens efficiency of the first lens is the proportion of the light incident on the first lens to the light emitted from the first emission area. The lens efficiency can be adjusted by changing the relative position of the emission area and the lens. When the lens is positioned, the position of the emission area with high lens efficiency is determined. The position with high lens efficiency can be referred to as "sweet spot".

In this specification, the lens may be disposed on the light extraction side of the light emitting apparatus, and the convex side of the lens may be on the light extraction side. If the light emitting apparatus emits light from both of the lower electrode side and the upper electrode side of the light emitting element, both the sides can be referred to as the light extraction side.

In this specification, the lens may be an optical member, such as a microlens. The lens shape may be spherical or aspherical. The lens may be a gradient index lens whose refraction index changes from the center of the lens to radially outside or a digital microlens in which ring patterns of a high refraction index material and a low refraction index material are arranged roughly and densely.

Embodiments will be described hereinbelow with reference to the drawings. It is to be understood that the following embodiments do not limit the present disclosure. The embodiments describe a plurality of configurations, but not all of the configurations are required for the disclosure. The configurations may be freely combined. In the attached drawings, the same or similar components are denoted by the same reference signs, and duplicated descriptions may be omitted.

First Embodiment

Figure 1B:
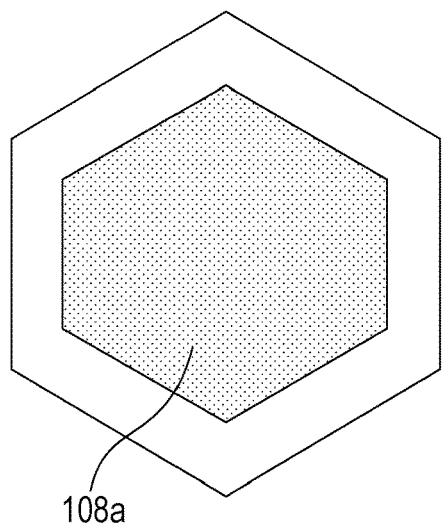
FIG. 1B is a plan view of each first light emitting element in FIG. 1A.
Figure 1C:
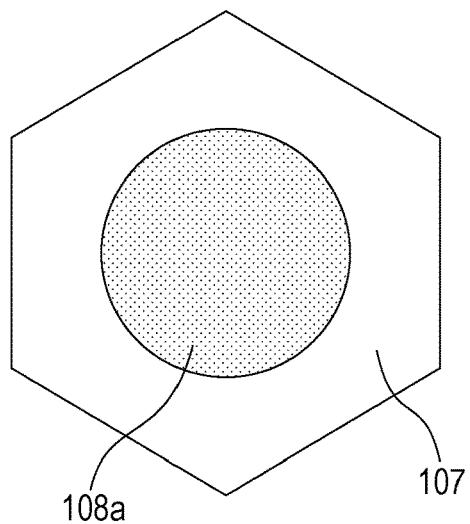
FIG. 1C is a plan view of each first light emitting element in FIG. 1A.

FIGS. 1A to 1C are diagrams illustrating an example of a first light emitting element and a third light emitting element of a light emitting apparatus according to an embodiment of the present disclosure. FIG. 1A is a cross-sectional view of the first light emitting element and the third light emitting element. FIG. 1B is a plan view of the first light emitting element and the third light emitting element in FIG. 1A. In this embodiment, the plan view of the first light emitting element and the plan view of the third light emitting element are the same except that the first light emitting element emits light of first color and the third light emitting element emits light of second color different from the first color. For this reason, the first light emitting element and the third light emitting element are illustrated by one plan view.

The light emitting apparatus of FIG. 1A includes, on a substrate 100, lower electrodes 101, a functional layer 102 including an emission layer, an upper electrode 103, a protective layer 104, a planarizing layer 105, microlenses 106, and an insulating layer 107 covering the opposite ends of each lower electrode 101. The insulating layer 107 is also referred to as a pixel separation layer or a bank. The planarizing layer 105, if made of resin, may also be referred to as a resin layer. The cross-sectional view of FIG. 1A is a cross section perpendicular to the principal surface of the substrate 100. FIG. 1B is a plan view of the light emitting apparatus observed in the direction perpendicular to the principal surface of the substrate 100.

The ends of the lower electrode 101 are covered by the insulating layer 107 in contact therewith. Part of the lower electrode 101 not in contact with the insulating layer 107 may be in contact with the functional layer 102. The area where the lower electrode 101 and the functional layer 102 are in contact is an emission area 108a that emits light when an electric field is applied between the lower electrode 101 and the upper electrode 103.

The emission area 108a may be specified by observing light emission at the application of an electric field in the same direction as in FIG. 1B. The emission area 108a may also be specified by measuring the distance from the end of a first insulating layer 107 covering the left end of the lower electrode 101 to the end of a second insulating layer 107 covering the right end of the lower electrode 101 in FIG. 1A. The ends of the insulating layer 107 may be the points of contact with the lower electrode 101.

In FIG. 1B, the emission area 108a is enclosed by the insulating layer 107. In this embodiment, the emission area 108a is hexagonal but may have another shape. For example, FIG. 1C illustrates a circular shape. The emission area 108a may be elliptical or may have a stripe arrangement in which rectangular red (R), green (G), and blue (B) emission areas are arranged for emission.

Figure 2A:
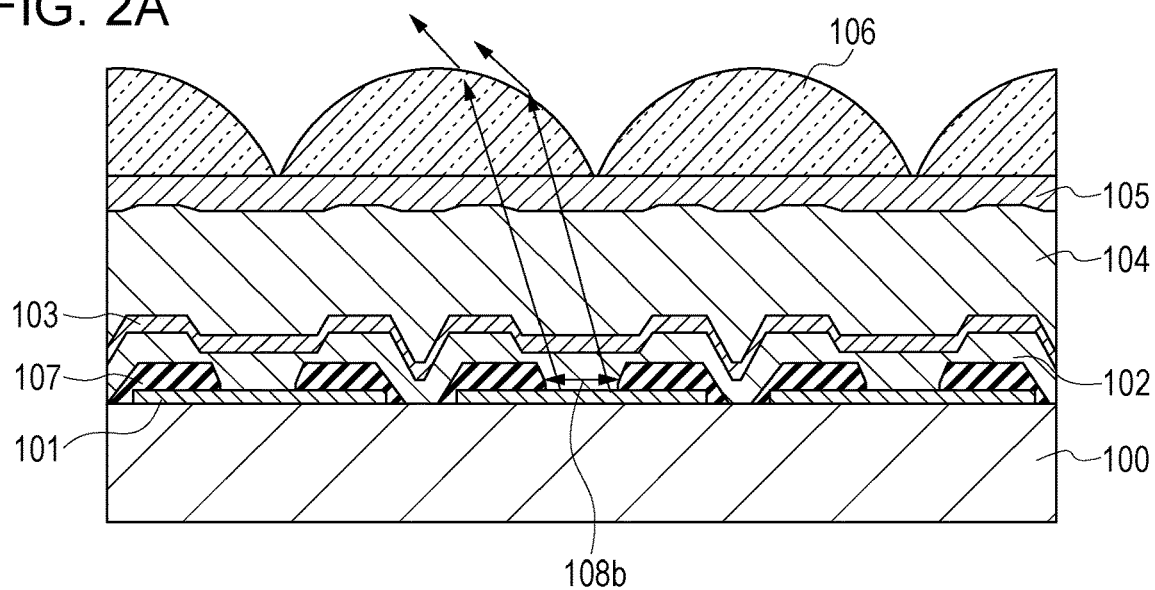
FIG. 2A is a cross-sectional view of second light emitting elements of the light emitting apparatus according to an embodiment of the present disclosure.
Figure 2B:
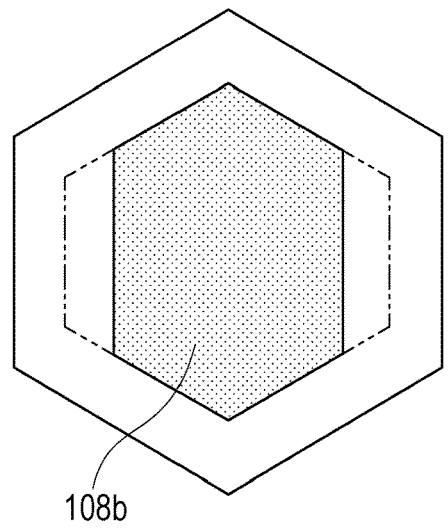
FIG. 2B is a plan view of each second light emitting element in FIG. 2A.
Figure 2C:
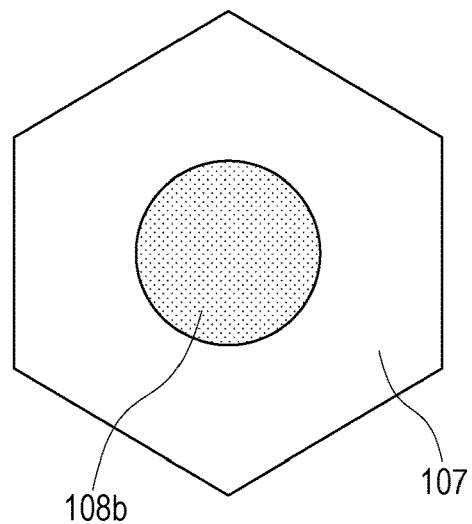
FIG. 2C is a plan view of each second light emitting element in FIG. 2A.

FIGS. 2A to 2C are diagrams illustrating a second light emitting element of the light emitting apparatus according to an embodiment of the present disclosure. The second light emitting element emits light of the first color. FIG. 2A is a cross-sectional view of the second light emitting element. FIG. 2B is a plan view of the second light emitting element in FIG. 2A. The cross-sectional view and the plan view are the same as those of FIGS. 1A to 1B. FIG. 2C illustrates a circular emission area 108b. A fourth light emitting element also has the same configuration.

The second light emitting element has a configuration similar to that of the first light emitting element. The distance between the middle point of the emission area 108b and the apex of the microlens 106 of the second light emitting element in the direction parallel to the principal surface of the substrate 100 is larger than the distance between the middle point of the emission area 108a and the apex of the microlens 106 of the first light emitting element. In other words, assuming that the microlens 106 of the first light emitting element is in the normal position, the microlens 106 of the second light emitting element is displaced therefrom.

If the microlens 106 is a convex lens, the apex of the microlens 106 is farthest from the principal surface in a plane perpendicular to the principal surface of the substrate 100. If the microlens 106 is a concave lens, the apex of the microlens 106 is closest to the principal surface in the plane perpendicular to the principal surface of the substrate 100. In other words, the apex of the microlens 106 is the center of the microlens 106 in a cross section parallel to the principal surface of the substrate 100.

The emission area 108b of the second light emitting element is smaller than the emission area 108a of the first light emitting element. In other words, the emission area 108b in FIG. 2A is shorter in line segment than the emission area 108a in FIG. 1A. In other words, the area where the functional layer 102 is in contact with the lower electrode 101 is small.

Thus, the power consumption is reduced by decreasing the emission area 108b of the second light emitting element.

FIG. 2B illustrates an embodiment of the emission area 108b. In this embodiment, the emission area 108b is disposed such that two right and left sides in the plane of the drawing are disposed on the inner side of the hexagon than those of the emission area 108a. In other words, the emission area 108b of the second light emitting element is hexagonal, and at least one side of the hexagon is disposed inner side of the hexagon than that of the emission area 108a of the first light emitting element. The two sides of the hexagon are a pair of sides that are most distant from each other among the sides of the hexagon.

In this embodiment, two sides of the hexagon are arranged on the inner side of the hexagon than those of the emission area 108a. However, at least one side of a polygon may be disposed on the inner side than that of the emission area 108a of the first light emitting element.

Figure 3:
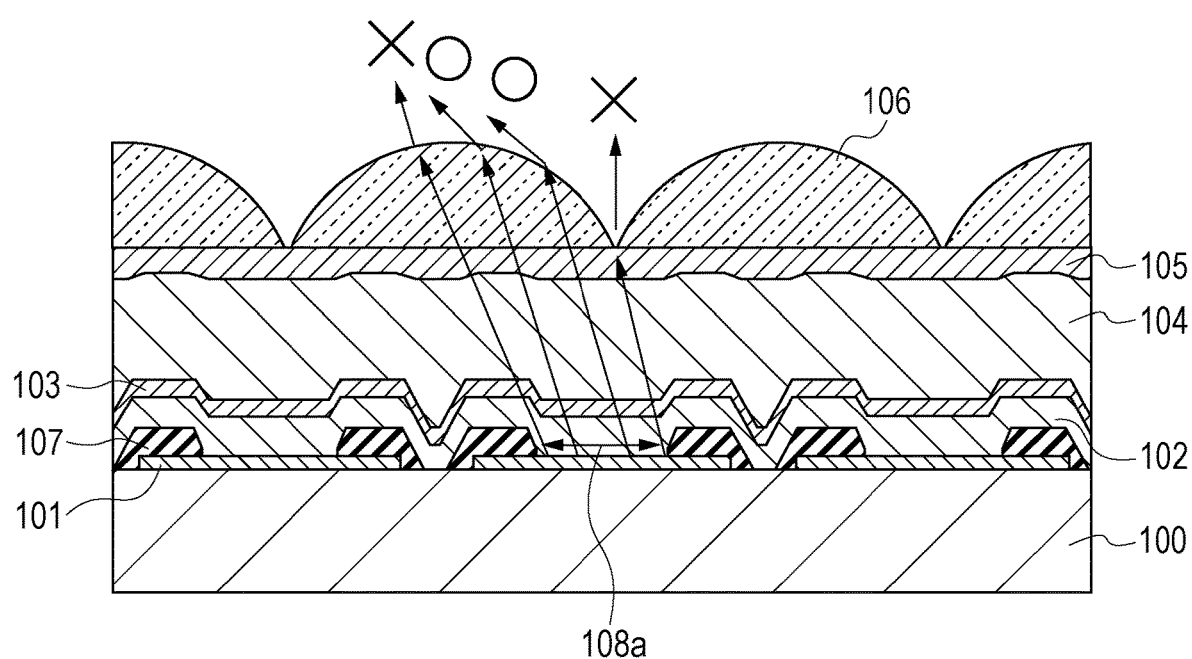
FIG. 3 is a cross-sectional view of a light emitting apparatus according to a comparable example.

FIG. 3 is a cross-sectional view of a comparable example. In this example, the positional relationship between the emission area of the second light emitting element and the optical member differs from the positional relationship of the first light emitting element, but the emission area of the second light emitting element has the same size as the size of the emission area of the first light emitting element. The fact that the positional relationship between the second light emitting element and the optical member differs from that of the first light emitting element indicates that the optical members are out of alignment. The direction of the misalignment of the optical members may be a direction in which the light emitted from the emission layer is to be bent.

As in FIG. 3, the light from an end of the emission area 108a is unlikely to be refracted in oblique directions. In contrast, light from the center of the emission area 108a is likely to be refracted in oblique directions.

The light toward the left in the drawing, that is, the light denoted by "0" is light contributing to the light emission of the display apparatus. Assuming that the left in the drawing is the outer periphery of the display area, the peripheral area of the display area uses light directed in the oblique directions with respect to the display surface. The other light, in other words, the light denoted by "x", is light that does not contribute to the light emission of the display apparatus. For that reason, a low power consumption light emitting apparatus can be provided by causing the area that can refract light in the oblique directions to emit light as in the configurations of FIGS. 1A to 1C and FIGS. 2A to 2C, described in the first embodiment, to increase the light use efficiency.

Many display apparatuses that use light directed in oblique directions with respect to the display surface in the peripheral area of the display apparatus include a display and an optical system, in which the user views the display through the optical system. With this configuration of display apparatuses, not emitting unused light also has the following benefits. For example, unused light entering an optical lens 120 in FIG. 14 becomes stray light, which may decrease the display quality. In the above embodiment, light that does not contribute to display is not emitted, which brings about the beneficial effect of reducing stray light. This effect differs between the first light and the second light. Accordingly, the emission areas of the light emitting element that emits the first light and the light emitting element that emits the second light differ in size.

Thus, the emission area that is less responsible for the light emission of the display apparatus can be decreased as in the second light emitting element.

According to this embodiment, the light emitted from the second light emitting element and the fourth light emitting element efficiently contribute to the light emission of the display apparatus, which reduces power consumption.

In this embodiment, the emission area of the fourth light emitting element is smaller than the emission area of the second light emitting element so as to decrease the difference in viewing angle dependency between the luminance of the first color and the luminance of the second color different from the first color.

Thus, the difference in intensity between the light emitted from the third light emitting element to the front of the display apparatus and the light emitted from the fourth light emitting element at wide angles to the display apparatus and the difference in intensity between the light emitted from the first light emitting element to the front of the display apparatus and the light emitted from the second light emitting element at wide angles to the display apparatus are decreased. In other words, a light emitting apparatus in which power consumption and color misregistration due to the viewing angle are reduced can be provided.

Second Embodiment

Figure 4A:
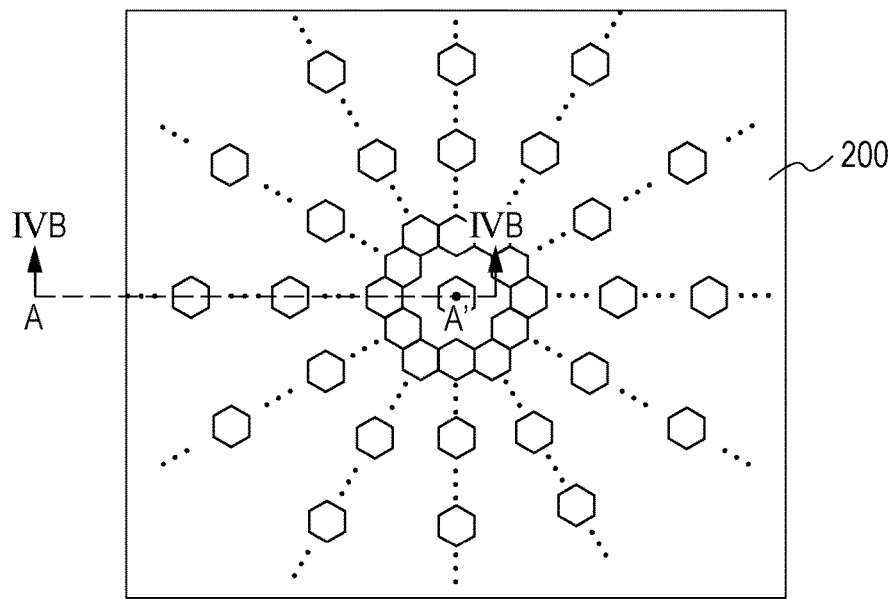
FIG. 4A is a plan view of a light emitting apparatus according to an embodiment of the present disclosure.
Figure 4B:
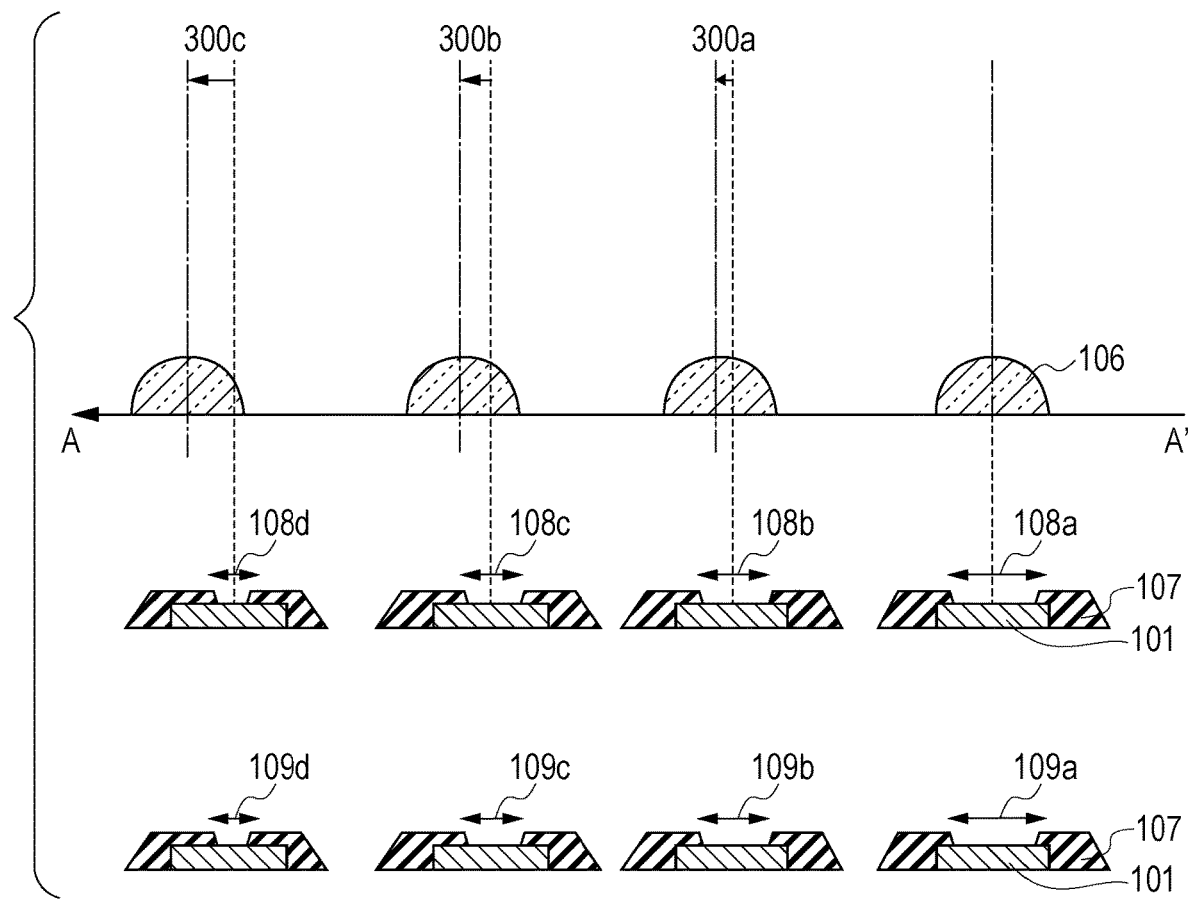
FIG. 4B is part of a cross-sectional view taken along line IVB-IVB in FIG. 4A.

FIGS. 4A and 4B are diagrams illustrating an example of the light emitting apparatus according to an embodiment of the present disclosure. FIG. 4A is a plan view of the light emitting apparatus seen in the direction perpendicular to the principal surface of the substrate 100 as in FIG. 1B. A display area 200 includes a plurality of light emitting elements. The positional relationship between the emission areas and the microlenses 106 will be described using a central portion A' and a peripheral portion A.

FIG. 4B is part of a cross-sectional view taken along line IVB-IVB in FIG. 4A. In the cross section, some of the light emitting elements are omitted. The positional relationship between the microlens 106 and emission areas 108 that emit first color light and emission areas 109 that emit second color light changes from portion A' to portion A. Specifically, the microlens 106 directly on an emission area 108b deviates to the left in the drawing by a microlens shift amount 300a with reference to the positional relationship between an emission area 108a and the microlens 106 directly on the emission area 108a. The emission area 108b is smaller than the emission area 108a. Likewise, the emission area 108c is smaller than the emission area 108b, and the microlens 106 directly on an emission area 108c deviates by an amount 300b. An emission area 108d is smaller than the emission area 108c, and the microlens 106 directly on the emission area 108d deviates by an amount 300c. Likewise, emission areas 109a to 109d decrease in size in this order.

The light emitting elements disposed between the emission areas 108a and 108b may have the same size as that of the emission areas 108a and 108b or may be smaller than the emission area 108a and larger than the emission area 108b. The plurality of light emitting elements disposed between the emission areas 108a and 108b may increase in emission area with a decreasing distance to the emission area 108*a* and may decrease in emission area with a decreasing distance to the emission area 108*b*. The same applies to the emission areas 109 including the third light emitting element and the fourth light emitting element that emit the second color light.

The displacement of the microlenses 106 may increase continuously or stepwise from the central portion A' to the peripheral portion A of the display area 200. The continuous or stepwise decrease in emission area reduces light that does not contribute to the light emission of the display apparatus in the display area. Setting the emission area 109 of the light emitting element that emits the second color light smaller than the emission area 108 of the light emitting element that emits the first color light reduces the difference in viewing angle characteristics of luminance of the individual colors.

For example, in FIG. 4A, the light emitting elements nearer to A than A' are outer elements. In other words, the light emitting elements farther from the central portion A' are outer light emitting elements.

In other words, the light emitting apparatus according to this embodiment may be a light emitting apparatus in which the gap between the microlens and the emission area increases continuously. Specifically, the light emitting apparatus according to this embodiment includes a substrate including a principal surface, first, second, third, and fourth light emitting elements, a first lens that receives light emitted from the first light emitting element, a second lens that received light emitted from the second light emitting element, a third lens that receives light emitted from the third light emitting element, and a fourth lens that receives light emitted from the fourth light emitting element. In light emitting apparatus according to this embodiment, in a cross section perpendicular to the principal surface, the distance between the middle point of the emission area of the second light emitting element and the apex of the second lens in the direction parallel to the principal surface is larger than the distance between the middle point of the emission area of the first light emitting element and the apex of the first lens in the direction parallel to the principal surface. The distance between the middle point of the emission area of the fourth light emitting element and the apex of the fourth lens in the direction parallel to the principal surface is larger than the distance between the middle point of the emission area of the third light emitting element and the apex of the third lens in the direction parallel to the principal surface. The difference between the distance between the middle point of the emission area of the second light emitting element and the apex of the second lens in the direction parallel to the principal surface and the distance between the middle point of the emission area of the first light emitting element and the apex of the first lens in the direction parallel to the principal surface is equal to or less than the difference between the distance between the middle point of the emission area of the fourth light emitting element and the apex of the fourth lens in the direction parallel to the principal surface and the distance between the middle point of the emission area of the third light emitting element and the apex of the third lens in the direction parallel to the principal surface. The emission area of the second light emitting element is smaller than the emission area of the first light emitting element. The emission area of the fourth light emitting element is smaller than the emission area of the third light emitting element. The emission area of the fourth light emitting element is smaller than the emission area of the second light emitting element. The first and second light emitting elements emit first light. The third and fourth light emitting elements emit second light with a wavelength different from that of the first light. In other words, the second light is different in color from the first light.

The difference between the distance between the middle point of the emission area of the second light emitting element and the apex of the second lens in the direction parallel to the principal surface and the distance between the middle point of the emission area of the first light emitting element and the apex of the first lens in the direction parallel to the principal surface may be equal to the difference between the distance between the middle point of the emission area of the fourth light emitting element and the apex of the fourth lens in the direction parallel to the principal surface and the distance between the middle point of the emission area of the third light emitting element and the apex of the third lens in the direction parallel to the principal surface.

The light emitting element disposed between the light emitting elements 108*a* and 108*b* in this embodiment can be referred to as a fifth light emitting element. In other words, the light emitting apparatus may further include a fifth light emitting element disposed between the first light emitting element and the second light emitting element and next to the second light emitting element and a fifth lens that receives light emitted from the fifth light emitting element, wherein, in a cross section perpendicular to the principal surface, the distance between the middle point of the emission area of the fifth light emitting element and the apex of the fifth lens in the direction parallel to the principal surface may be equal to the distance between the middle point of the emission area of the second light emitting element and the apex of the second lens in the direction parallel to the principal surface.

In this case, the difference in size between the emission area of the fifth light emitting element and the emission area of the second light emitting element may be smaller than the difference in size between the emission area of the second light emitting element and the emission area of the first light emitting element. More specifically, the size of the emission area of the fifth light emitting element may be equal to the emission area of the second light emitting element.

A light emitting element disposed nearer to the periphery of the substrate than the light emitting element 108*b*, specifically, a light emitting element disposed between light emitting elements 108*b* and 108*c* can be referred to as a sixth light emitting element. In other words, the light emitting apparatus may further include the sixth light emitting element next to the second light emitting element and a sixth lens that receives light emitted from the sixth light emitting element, wherein the second light emitting element may be disposed between the first light emitting element and the sixth light emitting element.

In a cross section perpendicular to the principal surface, the distance between the middle point of the emission area of the sixth light emitting element and the apex of the sixth lens in the direction parallel to the principal surface may be larger than the distance between the middle point of the emission area of the second light emitting element and the apex of the second lens in the direction parallel to the principal surface.

In this case, the emission area of the sixth light emitting element may be smaller than the emission area of the second light emitting element.

Like the light emitting element that emits the first light, the light emitting element that emits the second light may include a seventh light emitting element and an eighth light emitting element. In other words, the light emitting apparatus according to this embodiment may further include the seventh light emitting element disposed between the third light emitting element and the fourth light emitting element and next to the fourth light emitting element and a seventh lens that receives light emitted from the seventh light emitting element, wherein, in a cross section perpendicular to the principal surface, the distance between the middle point of the emission area of the seventh light emitting element and the apex of the seventh lens in the direction parallel to the principal surface may be equal to the distance between the middle point of the emission area of the fourth light emitting element and the apex of the fourth lens in the direction parallel to the principal surface.

In this case, the difference in size between the emission area of the seventh light emitting element and the emission area of the fourth light emitting element may be smaller than the difference in size between the emission area of the fourth light emitting element and the emission area of the third light emitting element.

The light emitting apparatus according to this embodiment may further include an eighth light emitting element next to the fourth light emitting element and an eighth lens that receives light emitted from the eighth light emitting element, wherein the fourth light emitting element may be disposed between the third light emitting element and the eighth light emitting element, and wherein, in a cross section perpendicular to the principal surface, the distance between the middle point of the emission area of the eighth light emitting element and the apex of the eighth lens in the direction parallel to the principal surface may be larger than the distance between the middle point of the emission area of the fourth light emitting element and the apex of the fourth lens in the direction parallel to the principal surface.

In this case, the emission area of the eighth light emitting element may be smaller than the emission area of the fourth light emitting element.

The light emitting apparatus according to this embodiment may be configured such that the displacement of the microlenses increases continuously. The light emitting apparatus according this embodiment may further include a fifth light emitting element disposed between the first light emitting element and the second light emitting element and next to the second light emitting element and a fifth lens that receives light emitted from the fifth light emitting element, wherein, in a cross section perpendicular to the principal surface, the distance between the middle point of the emission area of the fifth light emitting element and the apex of the fifth lens in the direction parallel to the principal surface may be smaller than the distance between the middle point of the emission area of the second light emitting element and the apex of the second lens in the direction parallel to the principal surface, and wherein, in a cross section perpendicular to the principal surface, the distance between the middle point of the emission area of the fifth light emitting element and the apex of the fifth lens in the direction parallel to the principal surface may be larger than the distance between the middle point of the emission area of the first light emitting element and the apex of the first lens in the direction parallel to the principal surface.

In this case, the emission area of the fifth light emitting element may be larger than the emission area of the second light emitting element and smaller than the emission area of the first light emitting element.

The light emitting apparatus according to this embodiment may further include a sixth light emitting element next to the second light emitting element and a sixth lens that receives light emitted from the sixth light emitting element, wherein the second light emitting element may be disposed between the first light emitting element and the sixth light emitting element, and wherein, in a cross section perpendicular to the principal surface, the distance between the middle point of the emission area of the sixth light emitting element and the apex of the sixth lens in the direction parallel to the principal surface may be larger than the distance between the middle point of the emission area of the second light emitting element and the apex of the second lens in the direction parallel to the principal surface.

In this case, the emission area of the sixth light emitting element may be smaller than the emission area of the second light emitting element.

The light emitting element that emits the second light may include a seventh light emitting element disposed between the third light emitting element and the fourth light emitting element and next to the fourth light emitting element and a seventh lens that receives light emitted from the seventh light emitting element, wherein, in a cross section perpendicular to the principal surface, the distance between the middle point of the emission area of the seventh light emitting element and the apex of the seventh lens in the direction parallel to the principal surface may be smaller than the distance between the middle point of the emission area of the fourth light emitting element and the apex of the fourth lens in the direction parallel to the principal surface, and wherein, in a cross section perpendicular to the principal surface, the distance between the middle point of the emission area of the seventh light emitting element and the apex of the seventh lens in the direction parallel to the principal surface may be larger than the distance between the middle point of the emission area of the third light emitting element and the apex of the third lens in the direction parallel to the principal surface.

In this case, the emission area of the seventh light emitting element may be smaller than the emission area of the third light emitting element and larger than the emission area of the fourth light emitting element.

Effect of Reducing Color Misregistration According to the Embodiment

Figure 5A:
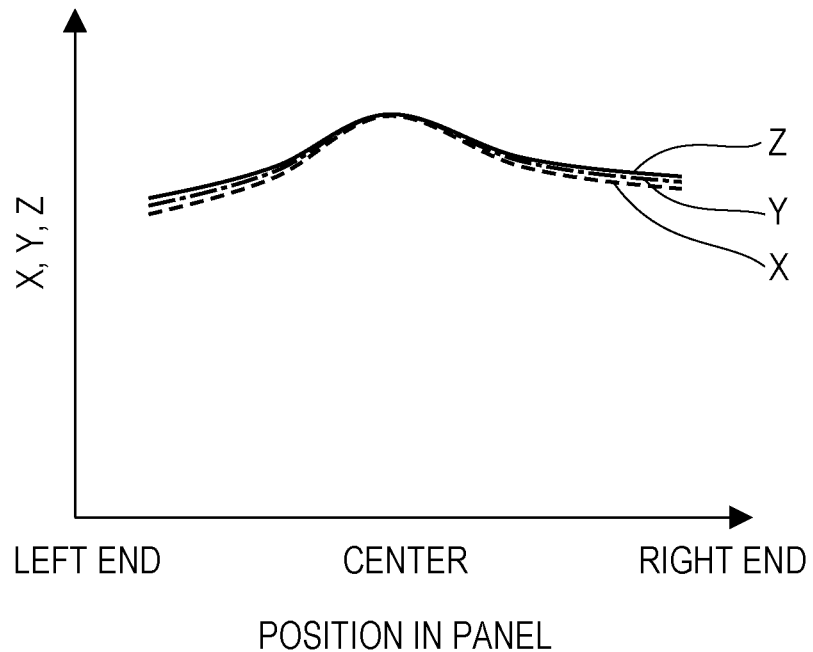
FIG. 5A is a graph showing the degree of color misregistration according to the position in the panel of the light emitting apparatus according to an embodiment of the present disclosure.
Figure 5B:
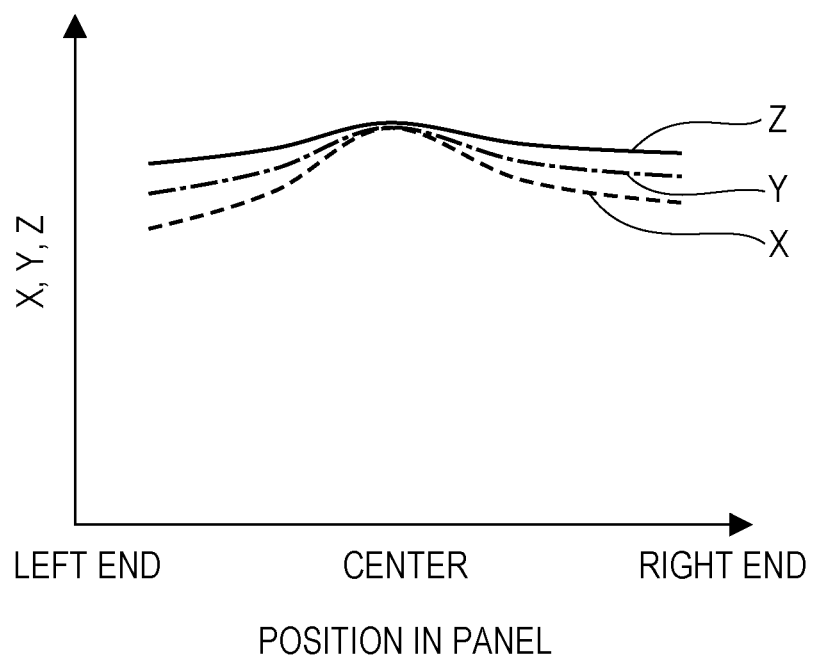
FIG. 5B is a graph showing the degree of color misregistration according to the position in the panel of the light emitting apparatus according to a comparative example.

FIGS. 5A and 5B are graphs in which tristimulus values according to the position of the display area in the light emitting apparatus are normalized. The vertical axis indicates the tristimulus values, and the horizontal axis indicates positions in the panel. FIG. 5A is a graph showing normalized tristimulus values in the case where the emission area 109 of the light emitting element that emits the second color light is smaller than the emission area 108 of the light emitting element that emits the first color light. The difference among the tristimulus values is reduced at the peripheral portion of the display area, the right end of the panel, and the left end of the panel, in other words, color misregistration is reduced. Since the emission area 109 of the light emitting element that emits the second color light is smaller than the emission area 108 of the light emitting element that emits the first color light, the difference in viewing angle characteristics among the colors is reduced, and the difference in luminance among the colors in the display surface is reduced.

In contrast, FIG. 5B is a graph of normalized tristimulus values in the case where the emission area 109 of the light emitting element that emits the second color light and the emission area 108 of the light emitting element that emits the first color light have the same size. The tristimulus values differ at the peripheral portion of the display area, the right end of the panel, and the left end of the panel. In other words, color misregistration cannot be reduced. The central area in the central portion of the display area uses light rays directed to the front of the display surface. In contrast, the peripheral area of the display area uses light rays directed in oblique directions with respect to the display surface. Color-by-color luminance differs in the display surface because of the difference in color-by-color viewing angle.

Third Embodiment

Figure 6:
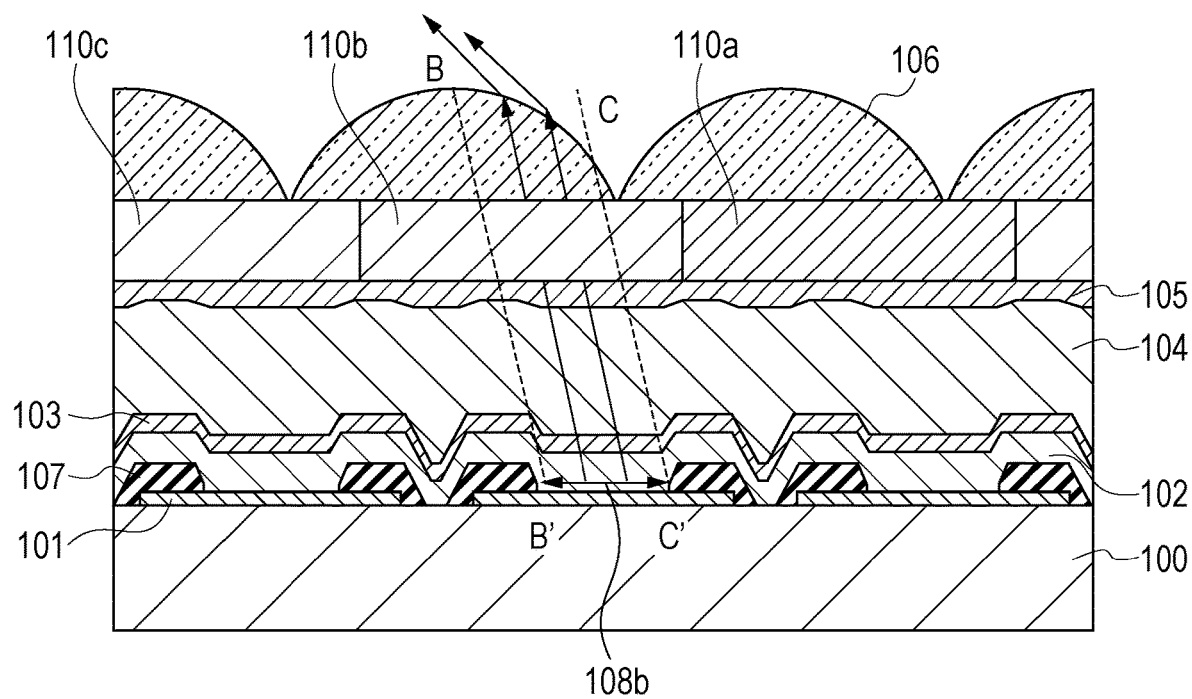
FIG. 6 is a schematic cross-sectional view of a light emitting apparatus according to an embodiment of the present disclosure.

FIG. 6 is a schematic cross-sectional view of a light emitting apparatus according to an embodiment of the present disclosure. In addition to the components of the first embodiment, color filters 110a to 110c are disposed on the planarizing layer 105. Pixels including the color filters 110a to 110c individually can be regarded as subpixels, and the three subpixels can be regarded as one main pixel. The subpixels are not limited to red (R), green (G), and blue (B) pixels. For example, a white light emitting element and a yellow light emitting element may be provided. In the case of the white light emitting element, the color filter may be a transparent filter, or alternatively, no filter may be provided. The subpixels can be red, green, and blue. Adding and mixing these colors enables full-color display.

The planar arrangement of the subpixels may be any of a stripe arrangement, a square arrangement, a delta arrangement, and a Bayer arrangement. Matrix arrangement of the main pixels provides a high pixel count display apparatus.

The color filters 110a to 110c are also deviated from the center of the emission area 108b as the microlenses 106 are. The color filter 110b may be disposed on the line connecting the apex B of the microlens 106 and an end B' of the emission area 108b adjacent to the first light emitting element.

The color filters 110b is on the line connecting an end C of the microlens 106 and an end C' of the emission area 108b. At least two kinds of color filter may be disposed on the line connecting the apex of the microlens 106 directly on the emission area 108b and the emission area next to the emission area 108b.

Light emission from the next emission area is for reducing emission from an unintended microlens.

The light emitted from the emission area 108b passes through the color filters 110b and can be refracted in an oblique direction by the microlens 106 and does not pass through the color filters 110a and 110c of the other subpixels. This improves the chromatic purity.

Design of Microlenses According to the Embodiment

Figure 7:
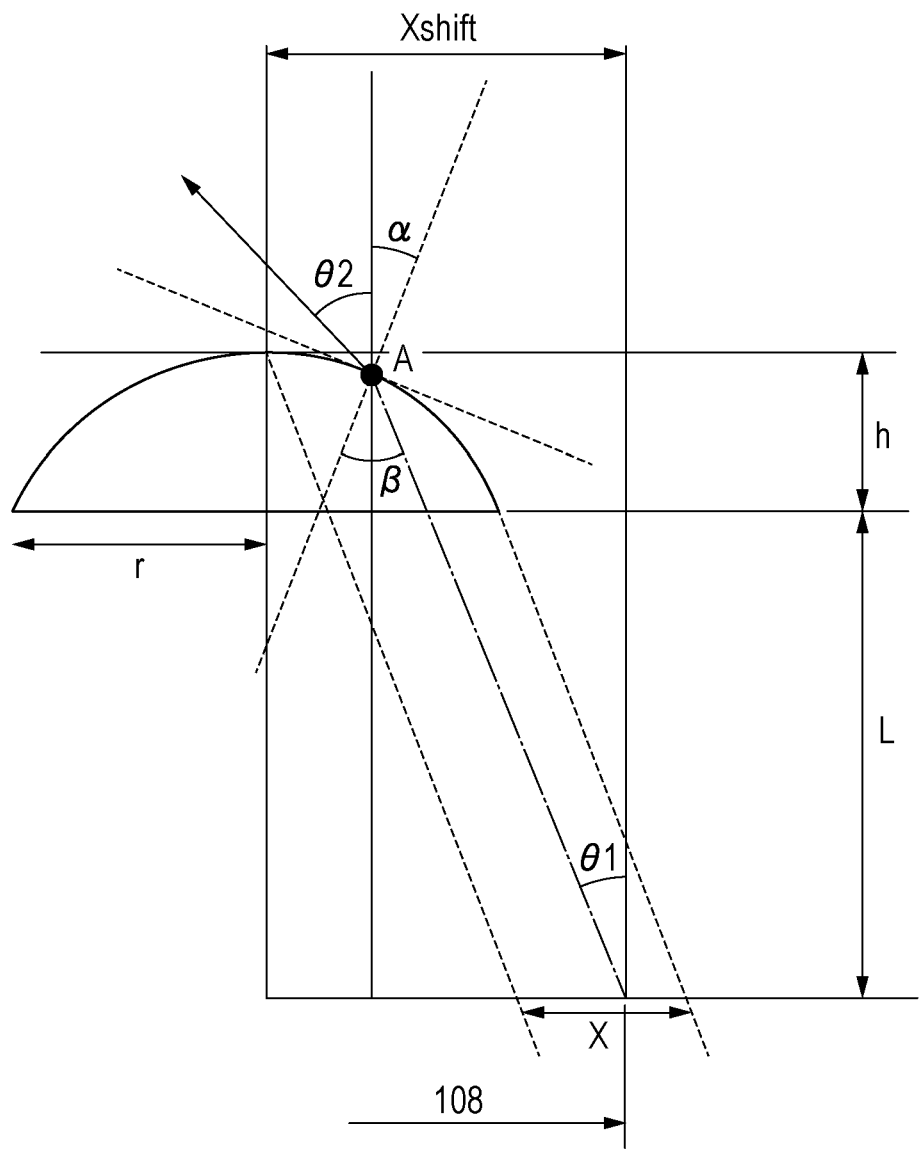
FIG. 7 is a cross-sectional view of a microlens according to an embodiment of the present disclosure.

FIG. 7 is a cross-sectional view of the microlens 106 illustrating the relationship between the microlens 106 and the emission area 108 of the light emitting element that emits the first color light, the emission area 109 of the light emitting element that emits the second color light.

FIG. 7 illustrates the microlens 106 with a height of h, a radius of r, and a refraction index of n.

Light is emitted at an angle of $\theta1$ from the emission area 108 of the light emitting element that emits the first color light and is bent at an angle of $\theta2$ by a point A of the microlens 106. Let $\alpha$ be the inclination of the microlens 106 at point A with respect to the tangent. Eq. 1 holds according to Snell's law. In the drawing, $\alpha+\theta1$ is expressed as $\beta$.

$$1\times\sin(\theta2+\alpha)=n\times\sin(\alpha+\theta1) \quad \text{Eq. 1}$$

Solving Eq. 1 for $\theta1$ gives Eq. 2.

$$\theta1=\sin^{-1}\{\sin(\theta2+\alpha)/n\}-\alpha \quad \text{Eq. 2}$$

The size of an emission area X is expresses as Eq. 3, where Xshift is the shift amount of the apex of the microlens 106 from the center of the emission area 108, and L is the distance from the emission area 108 to the microlens 106.

$$X=r-h\times\tan(\theta1) \quad \text{Eq. 3}$$

The size X of the emission area 108 is given by Eq. 4 from Eq. 2 and Eq. 3.

$$X=r-h\times\tan[\sin^{-1}\{\sin(\theta2+\alpha)/n\}-\alpha] \quad \text{Eq. 4}$$

The relationship between the angle $\theta1$ of the light emitted from the emission area 108 and the shift amount Xshift of the apex of the microlens 106 from the center of the emission area 108 is expressed as Eq. 5.

$$\tan^{-1}(X\text{shift}/h+L)>\theta1 \quad \text{Eq. 5}$$

In a wave-optics simulation, calculations of the amount of shift of the apex of the microlens 106 from the center of the emission area 108 of the light emitting element that emits the first color light and the aperture ratio of the emission area 108 are shown in Table 1. By setting the amount of shift from the center of the emission area 109 of the light emitting element that emits the second color light and the aperture ratio of the emission area 109 smaller than those of Table 1, the color misregistration according to the viewing angle is reduced.

However, actually, the protective layer 104, the color filters 109, and other members are present between the microlens 106 and the emission area 108, which can cause error.

TABLE 1

| Distance between Apex of Microlens and Center of Light Emitting Area | Aperture Ratio of Light Emitting Area |
|---|---|
| 0 μm | 50% |
| 0.5 μm | 46% |
| 1.0 μm | 40% |
| 1.5 μm | 33% |

The light emitting apparatus according to this embodiment has an aperture ratio that increases as the distance between the apex of the microlens and the center of the emission area increases. The lens efficiency decreases as the distance between the apex of the microlens and the center of the emission area decreases, and the lens efficiency increases as the distance between the apex of the microlens and the center of the emission area increases. The lens efficiency is the ratio of luminance at any angle in a case with a lens to a case without a lens. Without an increase in sweet spot when the emission area increases in size, an area that does not contribute to light emission increases to decrease the lens efficiency. For wide-angle light, going out of the sweet spot in the case where the distance between the lens apex and the middle point of the emission area is large decreases the lens efficiency. The lens efficiency may be estimated at an angle of 45 degrees with respect to the optical axis of the lens.

In other words, the light emitting apparatus according to the embodiment includes a substrate including a principal surface, a first light emitting element, a second light emitting element, a third light emitting element, a fourth light emitting element, the first to fourth light emitting elements being disposed on the principal surface, a first lens that receives light emitted from the first light emitting element, a second lens that receives light emitted from the second light emitting element, a third lens that receives light emitted from the third light emitting element, and a fourth lens that receives light emitted from the fourth light emitting element, wherein the first light emitting element and the second light emitting element emit first light, and the third light emitting element and the fourth light emitting element emit second light that differs in wavelength from the first light, wherein, in a cross section perpendicular to the principal surface, the distance between the middle point of the emission area of the second light emitting element and the apex of the second lens in a direction parallel to the principal surface is larger than the distance between the middle point of the emission area of the first light emitting element and the apex of the first lens in the direction parallel to the principal surface, wherein the distance between the middle point of the emission area of the fourth light emitting element and the apex of the fourth lens in the direction parallel to the principal surface is larger than the distance between the middle point of the emission area of the third light emitting element and the apex of the third lens in the direction parallel to the principal surface, wherein the difference between the distance between the middle point of the emission area of the second light emitting element and the apex of the second lens in the direction parallel to the principal surface and the distance between the middle point of the emission area of the first light emitting element and the apex of the first lens in the direction parallel to the principal surface is equal to or less than the difference between the distance between the middle point of the emission area of the fourth light emitting element and the apex of the fourth lens in the direction parallel to the principal surface and the distance between the middle point of the emission area of the third light emitting element and the apex of the third lens in the direction parallel to the principal surface, and wherein the lens efficiency of the first lens is lower than the lens efficiency of the second lens, the lens efficiency of the third lens is lower than the lens efficiency of the fourth lens, and the lens efficiency of the fourth lens is lower than the lens efficiency of the second lens. The wavelength of the first light may be shorter than the wavelength of the second light. In other words, if the first light is blue, the second light may be green or red.

Configurations of Other Components of Embodiment

Configuration of Organic Light Emitting Element

The organic light emitting element includes an insulating layer, a first electrode, an organic compound layer, and a second electrode on a substrate. A protective layer, color filters, microlenses and so on may be provided on a negative electrode.

If color filters are provided, a planarizing layer may be provided between the color filters and the protective layer. The planarizing layer may be made of an acrylate resin or the like. This also applies to a planarizing layer disposed between the color filters and the microlenses.

Substrate

The substrate may be made of quartz, glass, a silicon wafer, resin, or metal. The organic light emitting element may include switching elements, such as transistors, and wiring lines on the substrate, as well as an insulating layer thereon. The insulating layer may have contact holes to allow wiring to the first electrode. The insulating layer may be made of any material that insulates unconnected wiring lines. Examples include resin, such as polyimide, silicon oxide, and silicon nitride.

Electrodes

A pair of electrodes can be used. The pair of electrodes may include a positive electrode and a negative electrode.

When an electric field is applied in the direction of light emission, a higher potential electrode is the positive electrode, and the other is the negative electrode. In other words, an electrode that supplies holes to the emission layer is the positive electrode, and an electrode that supplies electrons is the negative electrode.

A material for the positive electrode may have a work function as large as possible. Examples include elementary metals, such as gold, platinum, silver, copper, nickel, palladium, cobalt, selenium, vanadium, and tungsten, mixtures thereof, alloys thereof, and metal oxides, such as tin oxide, zinc oxide, indium oxide, indium tin oxide (ITO), and indium zinc oxide. Other examples include conductive polymers, such as polyaniline, polypyrrole, and polythiophene.

These electrode substances may be used alone or in combination of two or more kinds. The positive electrode may be in one layer or a plurality of layers.

For a reflecting electrode, chromium, aluminum, silver, titanium, tungsten, molybdenum, alloys thereof, or layers thereof may be used. A reflecting film that does not serve as an electrode may be made of the above materials. For a transparent electrode, example materials include, but are not limited to, transparent oxide conductive layers, such as indium tin oxide (ITO) and indicum zinc oxide.

The electrodes may be formed using a photolithography technique.

A material for the negative electrode may have a small work function. Examples include alkali metal, such as lithium, alkali earth metal, such as calcium, elementary metals, such as aluminum, titanium, manganese, silver, lead, and chromium, and mixtures thereof. Other examples include alloys of these elementary metals. Examples include magnesium-silver, aluminum-lithium, aluminum-magnesium, silver-copper, and zinc-silver alloys. Metal oxides such as indium tin oxide (ITO) may be used. These electrode materials may be used alone or in combination of two or more kinds. The negative electrode may be in one layer or multiple layers. Among them, silver may be used, or a silver alloy may be used to reduce aggregation of silver. Any alloy ratio that reduces silver aggregation may be employed. For example, the ratio of silver to another metal may be 1-1 or 3-1.

The negative electrode may be made of, but is not limited to, an oxide conductive layer, such as ITO, to serve as a top emission element, or may be made of a reflecting electrode, such as aluminum (Al), to serve as a bottom emission element. The negative electrode may be formed by, but is not limited to, direct-current sputtering or alternate-current sputtering to provide good film coverage, thereby easily decreasing the resistance.

Organic Compound Layer

The organic compound layer may be in a single layer or in multiple layers. In the case of multiple layers, the layers may be referred to as a hole injection layer, a hole transport layer, an electron blocking layer, an emission layer, a hole blocking layer, an electron transport layer, or an electron injection layer according to their functions. The organic compound layer is mainly composed of an organic compound but may contain inorganic atoms or an inorganic compound. Examples include copper, lithium, magnesium, aluminum, iridium, platinum, molybdenum, and zinc. The organic compound layer may be disposed between the first electrode and the second electrode and may be in contact with the first electrode and the second electrode.

Protective Layer

A protective layer may be provided on the negative electrode. For example, bonding glass with absorbent to the negative electrode reduces immersion of water or the like into the organic compound layer, thereby reducing display defect. In another embodiment, a passivation film, such as silicon nitride, may be provided on the negative electrode to reduce immersion of water or the like into the organic compound layer. For example, the negative electrode is formed and is then transported to another chamber under vacuum, where a silicon nitride film with a thickness of 2 μm is formed by chemical vapor deposition (CVD) to form a protective layer. After the film deposition using the CVD method, atom deposition (ALD) may be performed to form a protective layer. Example materials for forming a film by the ALD method include, but are not limited to, silicon nitride, silicon oxide, and aluminum oxide. Silicon nitride may be deposited by CVD on the film formed by the ALD method. The film formed by the ALD method may have a thickness smaller than that of the film formed by the CVD method. Specifically, the thickness may be 50% or less or 10% or less.

Color Filters

Color filters may be provided on the protective layer. For example, color filters formed in consideration of the size of the organic light emitting element may be provided on another substrate, and it may be bonded to a substrate provided with the organic light emitting element, or alternatively, color filters may be patterned on the protective layer using a photolithography technique. The color filters may be composed of a polymeric material.

Planarizing Layer

A planarizing layer may be disposed between the color filters and the protective layer. The planarizing layer is provided to reduce the unevenness of the layer thereunder. The layer is sometimes referred to as "material resin layer" without limiting the purpose. The planarizing layer may be composed of an organic compound and may be low molecular or high molecular.

The planarizing layer may be provided on and under the color filters. The materials may be the same or may differ. Specific examples include a polyvinyl carbazole resin, a polycarbonate resin, a polyester resin, an acrylonitrile-butadiene-styrene (ABS) resin, an acrylate resin, a polyimide resin, a phenol resin, an epoxy resin, a silicon resin, and a urea resin.

Microlens

The light emitting apparatus may include an optical member, such as a microlens, on the light emission side. The microlens can be formed of an acrylate resin or an epoxy resin. The microlens may be designed to increase the amount of light taken from the light emitting apparatus and control its direction. The microlens may have a hemispherical shape. Assume that the microlens has a hemispherical shape. Of tangent lines in contact with the hemisphere, a contact point between a tangent line parallel to the insulating layer and the hemisphere is the apex of the microlens. The apex of the microlens can be determined in any cross-sectional view. In other word, the apex of the microlens is, of the tangent lines in contact with the hemisphere of the microlens in cross-sectional view, a contact point between the tangent line parallel to the insulating layer and the hemisphere.

The middle point of the microlens can also be defined. Assuming a line segment from an end of the circular arc shape of a microlens to another end of the circular arc shape of the microlens in cross section, the middle point of the line segment can be referred to as the middle point of the microlens. The cross section for determining the apex and the middle point may be a cross section perpendicular to the insulating layer.

Counter Substrate

A counter substrate may be provided on the planarizing layer. The counter substrate is disposed at a position opposite to the above-described substrate and is referred to as "counter substrate". The material for the counter substrate may be the same as that of the above-described substrate. If the above-described substrate is a first substrate, the counter substrate may be a second substrate.

Organic Layer

The organic compound layers (a hole injection layer, a hole transport layer, an electron blocking layer, an emission layer, a hole blocking layer, an electron transport layer, an electron injection layer, and so on) constituting the organic light emitting element according to an embodiment of the present disclosure are formed by the following method.

The organic compound layers constituting the organic light emitting element according to an embodiment of the present disclosure can be formed by using a dry process, such as vacuum deposition, ionized deposition, sputtering, or plasma sputtering. In place of the dry process, a wet process of forming layers by applying a solution using an appropriate solvent by using a known coating method (for example, spin coating, dipping, a cast method, a Langmuir-Blodgett [LB] method, or an ink-jet method) may be used).

Layers formed using the vacuum deposition method or the solution coating method are unlikely to be crystalized and have high temporal stability. The coating method allows film deposition in combination with an appropriate binder resin.

Examples of the binder resin includes, but are not limited to, a polyvinyl carbazole resin, a polycarbonate resin, a polyester resin, an ABS resin, an acrylate resin, a polyimide resin, a phenol resin, an epoxy resin, a silicon resin, and a urea resin.

These binder resins may be used alone or in combination of two or more kinds as a homopolymer or a copolymer. A known additive, such as plasticizer, oxidation inhibitor, or ultraviolet absorbent, may be used as needed.

Pixel Circuit

The light emitting apparatus may include a pixel circuit connected to the light emitting element. The pixel circuit may be of an active matrix type that controls a first light emitting element and a second light emitting element independently. The active matrix circuit may be a voltage programing circuit or a current programing circuit. The drive circuit includes a pixel circuit for each pixel. The pixel circuit may include a light emitting element, a transistor that controls the emission luminance of the light emitting element, a transistor that controls the emission timing, a capacitor that holds the gate voltage of the transistor that controls the emission timing, and a transistor for connecting to a ground GND without passing through the light emitting element.

The light emitting apparatus includes a display area and a peripheral area disposed around the display area. The display area includes a pixel circuit. The peripheral area includes a display control circuit. The degree of movement of transistors constituting the pixel circuit may be lower than the degree of movement of transistors constituting the display control circuit.

The inclination of the current-voltage characteristics of the transistors constituting the pixel circuit may be smaller than the inclination of the current-voltage characteristics of the transistors constituting the display control circuit. The inclination of the current-voltage characteristics can be measured using so-called Vg-Ig characteristics.

The transistors constituting the pixel circuit are connected to light emitting elements including the first light emitting element.

The magnitude of the drive current may be determined according to the size of the emission area. Specifically, in causing the first light emitting element and the second light emitting element to emit light at the same luminance, the current for the first light emitting element may be smaller than the current for the second light emitting element. This is because the emission area of the first light emitting element is small, so that required current may be small.

Pixels

The light emitting apparatus includes a plurality of pixels. The pixels include subpixels that emit light of a color different from the other colors. The subpixels may individually emit R, G, and B lights.

The pixels emit light from an area called a pixel aperture.

The pixel aperture may be 15 µm or less and 5 µm or more in length. More specifically, the pixel aperture may be 11 µm, 9.5 µm, 7.4 µm, or 6.4 µm.

The distance between the subpixels may be 10 µm or less, specifically, 8 µm, 7.4 µm, and 6.4 µm.

The pixels can take a known arrangement in plan view. Examples include a stripe arrangement, a delta arrangement, a PenTile arrangement, and a Bayer arrangement. The subpixel may have any known shape in plan view. Examples include quadrangles, such as a rectangle and a rhombus, and a hexagon. Of course, any incorrect rectangular shape is included in rectangles. A combination of the shape of the subpixel and a pixel arrangement may be employed.

Use Application of Organic Light Emitting Element According to Embodiment of Disclosure The organic light emitting element according to an embodiment of the present disclosure can be used as a component of a display apparatus or an illumination apparatus. Other use applications include an exposing source for an electrophotographic image forming apparatus, a backlight of a liquid-crystal display apparatus, and a light emitting apparatus including a white light source with color filters.

The display apparatus may be an image information processing apparatus that includes an image input unit that receives image information from an area charge-coupled device (CCD), a linear CCD, a memory card, or the like and an information processing unit for processing the input information and that displays the input image on a display.

The display of an image capturing apparatus or an ink-jet printer may include a touch panel function. The drive method for the touch panel function may be, but is not limited to, of an infrared type, a capacitive type, a resistive type, or an electromagnetic induction type. The display apparatus may be used for the display of a multifunction printer.

Next, the display apparatus according to this embodiment will be described with reference to the drawings.

Figure 8A:
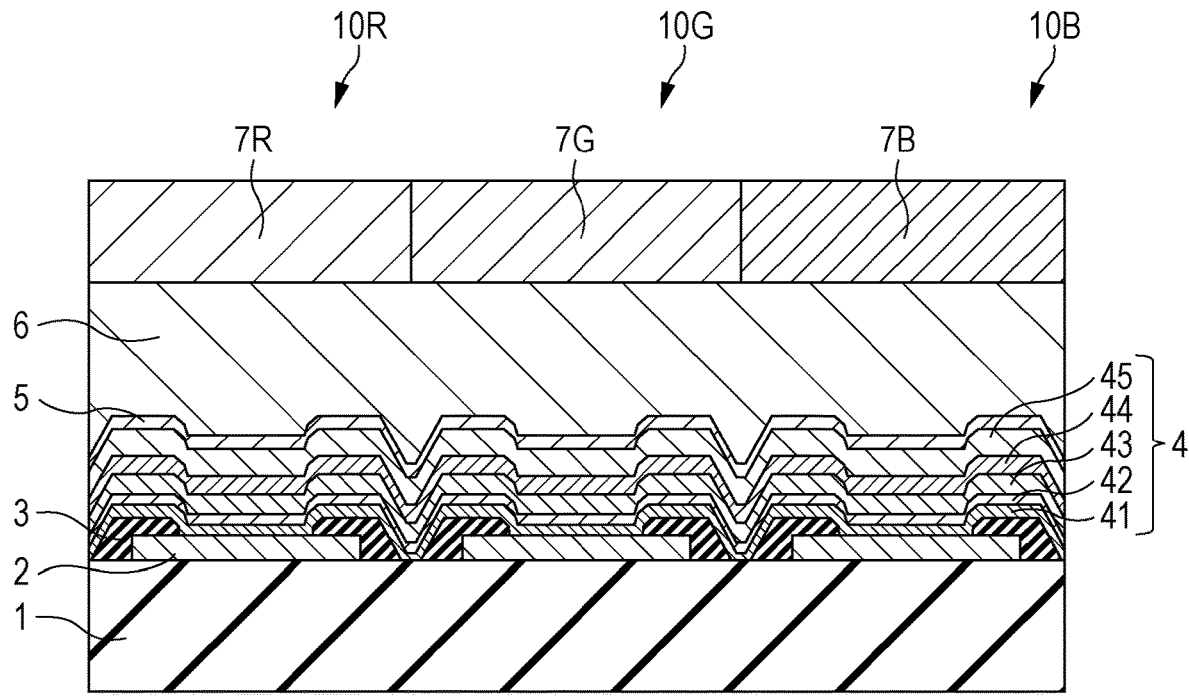
FIG. 8A is a schematic cross-sectional view of pixels of a light emitting apparatus according to an embodiment of the present disclosure.
Figure 8B:
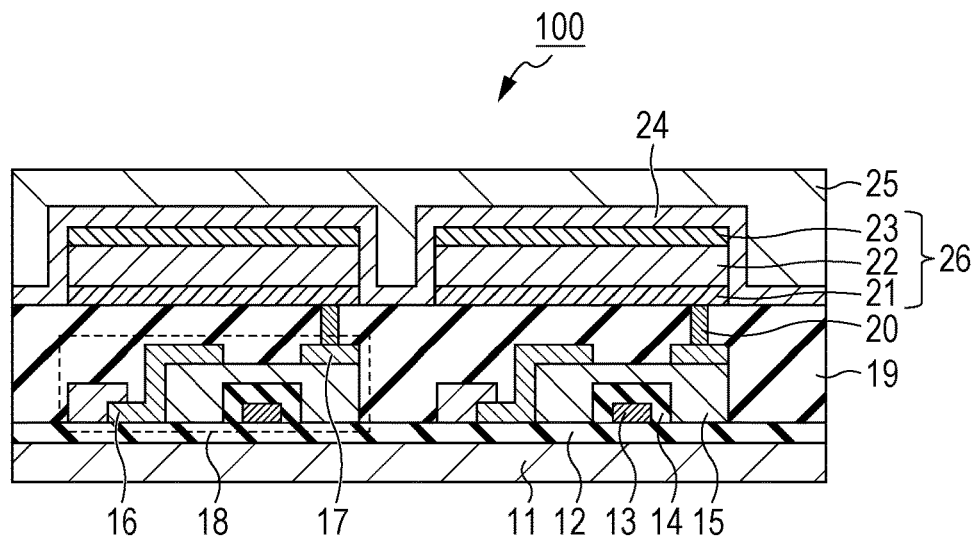
FIG. 8B is a schematic cross-sectional view of a light emitting apparatus according to an embodiment of the present disclosure.

FIGS. 8A and 8B are schematic cross-sectional views of an example of a display apparatus including organic light emitting elements and transistors connected to the organic light emitting elements. The transistor is an example of active elements. The transistor may be a thin-film transistor (TFT).

FIG. 8A illustrates an example of pixels, which are component of the display apparatus according to this embodiment. The pixels include subpixels 10. The subpixels 10 are divided into 10R, 10G, and 10B depending on the emission light. The emission colors may be distinguished according to the wavelength of the light emitted from the emission layer, or alternatively, the light exited from the subpixels 10 may be selectively filtered out or converted in color by color filters or the like. Each subpixel 10 includes, on an inter-layer insulating layer 1, a reflecting electrode 2 which is a first electrode, an insulating layer 3 covering the end of the reflecting electrode 2, an organic compound layer 4 covering the first electrode and the insulating layer, a transparent electrode 5, a protective layer 6, and color filters 7.

The inter-layer insulating layer 1 may include transistors and capacitative elements thereunder or therein.

The transistors and the first electrodes may be each electrically connected via a contact hole (not shown).

The insulating layer 3 is also called a bank or a pixel separation layer. The insulating layer 3 covers the end of the first electrode to enclose the first electrode. The portion of the first electrode in which the insulating layer 3 is not disposed is in contact with the organic compound layer 4 to serve as an emission area.

The organic compound layer 4 includes a hole injection layer 41, a hole transport layer 42, a first emission layer 43, a second emission layer 44, and an electron transport layer 45.

The second electrode 5 may be any of a transparent electrode, a reflecting electrode, and a semitransparent electrode.

The protective layer 6 reduces penetration of water into the organic compound layer 4. Although the protective layer 6 is a single layer in the drawing, it may have multiple layers. The protective layer 6 may include an inorganic compound layer and an organic compound layer.

The color filters 7 are divided into 7R, 7G, and 7B according to the color. The color filters 7 may be formed on a planarizing layer (not shown). A resin protective layer (not shown) may be provided on the color filters 7. The color filters 7 may be disposed on the protective layer 6. The color filters 7 may be disposed on a counter substrate, such as a glass substrate, and then may be bonded.

The display apparatus 100 shown in FIG. 8B includes organic light emitting elements 26 and thin-film transistors (TFTs) 18 as an example of transistors. An insulating layer 12 is disposed on a glass or silicon substrate 11. The TFTs (active elements) 18 are disposed on the insulating layer 12. The TFTs 18 each include a gate electrode 13, a gate insulating film 14, and a semiconductor layer 15. The TFT 18 further includes a drain electrode 16 and a source electrode 17. An insulating film 19 is disposed on the TFTs 18. A positive electrode 21 constituting the organic light emitting element 26 and the source electrode 17 are connected through a contact hole 20 in the insulating film 19.

The configuration of electrical connection of the electrodes (the positive electrode 21 and the negative electrode 23) included in the organic light emitting element 26 and the electrodes (the source electrode 17 and the drain electrode 16) included in the TFT 18 is not limited to the configuration shown in FIG. 8B. In other words, one of the positive electrode 21 and the negative electrode 23 and one of the source electrode and the drain electrode of the TFT 18 are only be electrically connected. The TFT 18 refers to a thin-film transistor.

Although an organic compound layer 22 of the display apparatus 100 in FIG. 8B is a single layer, the organic compound layer 22 may have multiple layers. A first protective layer 24 and a second protective layer 25 are disposed on the negative electrode 23 to reduce degradation of the organic light emitting element 26.

Although the display apparatus 100 in FIG. 8B includes transistors as switching elements, other switching elements may be used.

The transistors of the display apparatus 100 in FIG. 8B are not limited to transistors using single-crystal silicon wafers but may be thin-film transistors including an active layer on the insulating surface of the substrate. Examples of the active layer include non-single-crystal silicon, such as single-crystal silicon, amorphous silicon, and microcrystal silicon, and non-single-crystal oxide semiconductors, such as indium zinc oxide and indium gallium zinc oxide. The thin-film transistors are also referred to as TFT devices.

The transistors included in the display apparatus 100 in FIG. 8B may be formed in a substrate such as a silicon substrate. The terms "transistors are formed in a substrate" indicates that the substrate itself, such as a silicon substrate, is processed to produce transistors. In other words, the fact that the substrate includes the transistors therein indicates that the substrate and the transistors are integrally formed.

The emission luminance of the organic light emitting element according to this embodiment is controlled by a TFT which is an example of switching devices. By providing a plurality of organic light emitting elements in a plane, an image can be displayed at individual emission luminance. The switching device according to this embodiment is not limited to the TFT and may be a transistor made of low-temperature polysilicon or an active matrix driver formed on a substrate, such as a silicon substrate. The terms "on the substrate" includes "in the substrate". Whether to dispose transistors in the substrate or to use TFTs is selected according to the size of the display. If the display is about 0.5 inches in size, the organic light emitting elements may be disposed on a silicon substrate.

Figure 9:
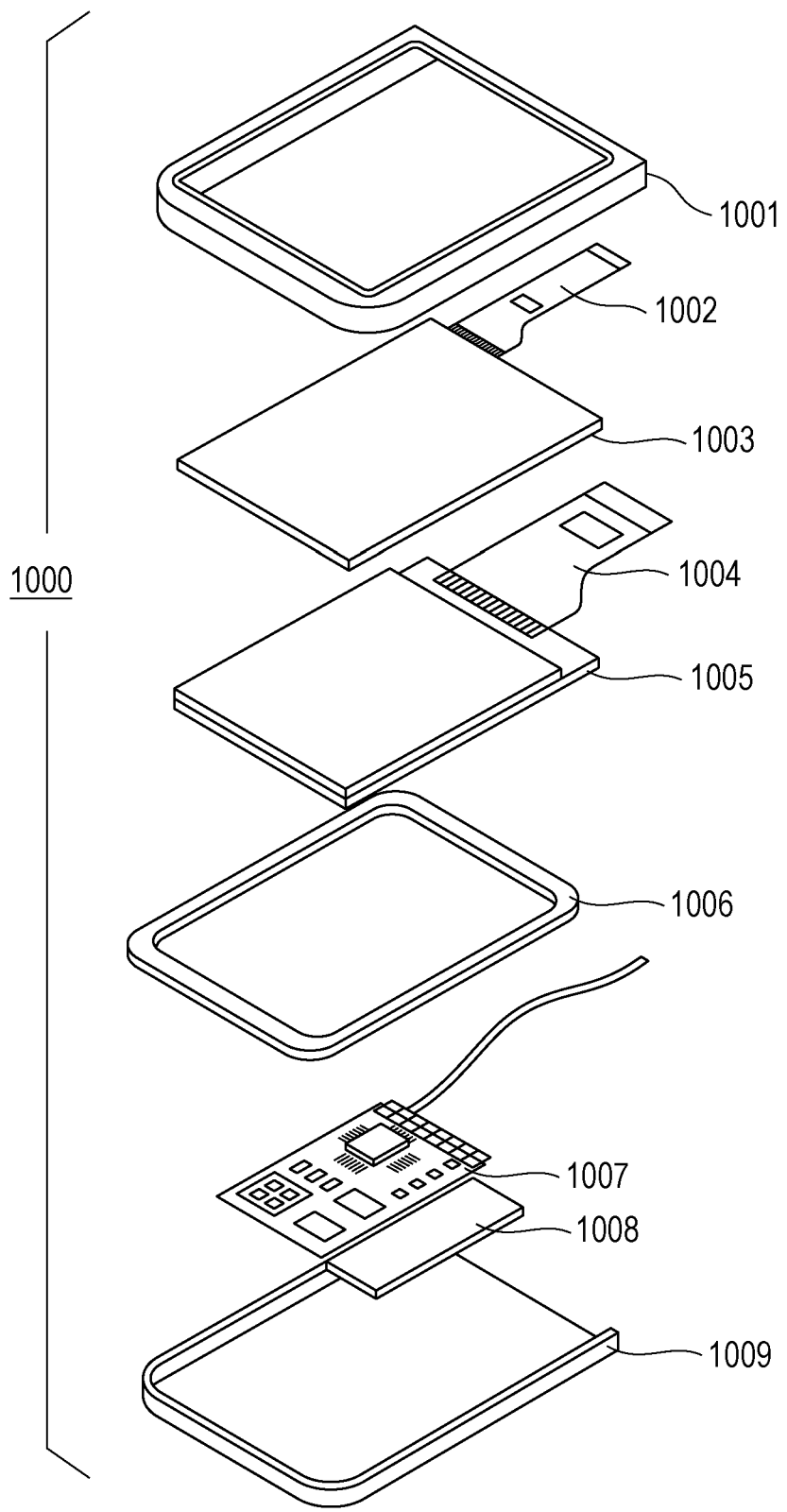
FIG. 9 is a schematic diagram illustrating a display apparatus according to an embodiment of the present disclosure.

FIG. 9 is a schematic diagram illustrating an example of the display apparatus according to this embodiment. The display apparatus 1000 may include a touch panel 1003, a display panel 1005, a frame 1006, a circuit board 1007, and a battery 1008 between an upper cover 1001 and a lower cover 1009. The touch panel 1003 and the display panel 1005 connect to flexible printed circuits (FPCs) 1002 and 1004, respectively. Transistors are printed on the circuit board 1007. The battery 1008 is not needed if the display apparatus is not a mobile device or may be disposed at another location if it is a mobile device.

The display apparatus according to this embodiment may include red, green, and blue color filters. The color filters may be arranged in a delta arrangement of red, green, and blue.

The display apparatus according to this embodiment may be used for the display of a mobile terminal. In this case, the display apparatus may include both of a display function and an operation function. Examples of the mobile terminal include mobile phones, such as a smartphone, a tablet, and a head mount display.

The display apparatus according to this embodiment may be used for the display of an image capturing apparatus including an optical unit including a plurality of lenses and an image sensor that receives light passing through the optical unit. The image capturing apparatus may include a display that displays information that the image sensor captures. The display may be exposed out of the image capturing apparatus or disposed in the finder. The image capturing apparatus may be a digital camera or a digital video camera.

Figure 10A:
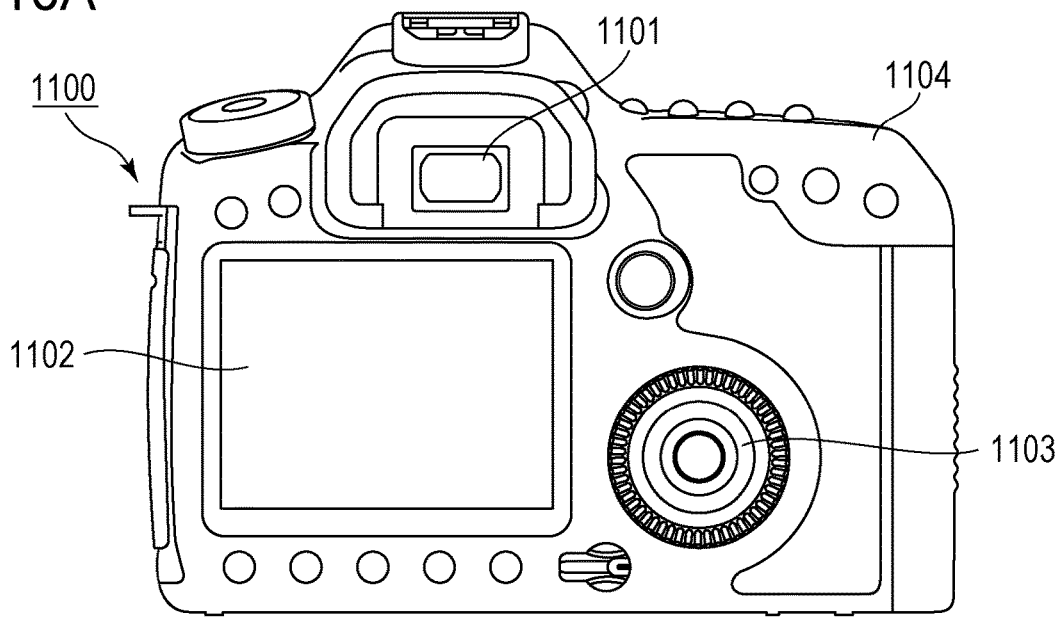
FIG. 10A is a schematic diagram illustrating an image capturing apparatus according to an embodiment of the present disclosure.

FIG. 10A is a schematic diagram illustrating an example of the image capturing apparatus according to this embodiment. The image capturing apparatus 1100 may include a viewfinder 1101, a back display 1102, an operating unit 1103, and a casing 1104. The viewfinder 1101 may include the display apparatus according to this embodiment. In this case, the display apparatus may display not only an image to be captured but also environmental information and image-capturing instructions. The environmental information may include the intensity and direction of outside light, the moving speed of the subject, and the possibility that the subject will be blocked by a shield.

The information should be displayed as fast as possible because the best timing for image capturing is short. Accordingly, a display apparatus including the organic light emitting element according to an embodiment of the present disclosure may be used. This is because the organic light emitting element has a fast response speed. The display apparatus including the organic light emitting element can be used more suitably for apparatuses that require high display speed than liquid crystal display apparatuses.

The image capturing apparatus 1100 includes an optical unit (not shown). The optical unit includes a plurality of lenses and forms an image on an image sensor housed in the casing 1104. Adjusting the relative positions of the multiple lenses allows adjusting the focus. This operation can be performed automatically. The image capturing apparatus may also be referred to as "photoelectric transducer". The photoelectric transducer may adopt not a sequential image capturing method but a method of detecting the difference from the previous image and a method of clipping an image from recorded images.

Figure 10B:
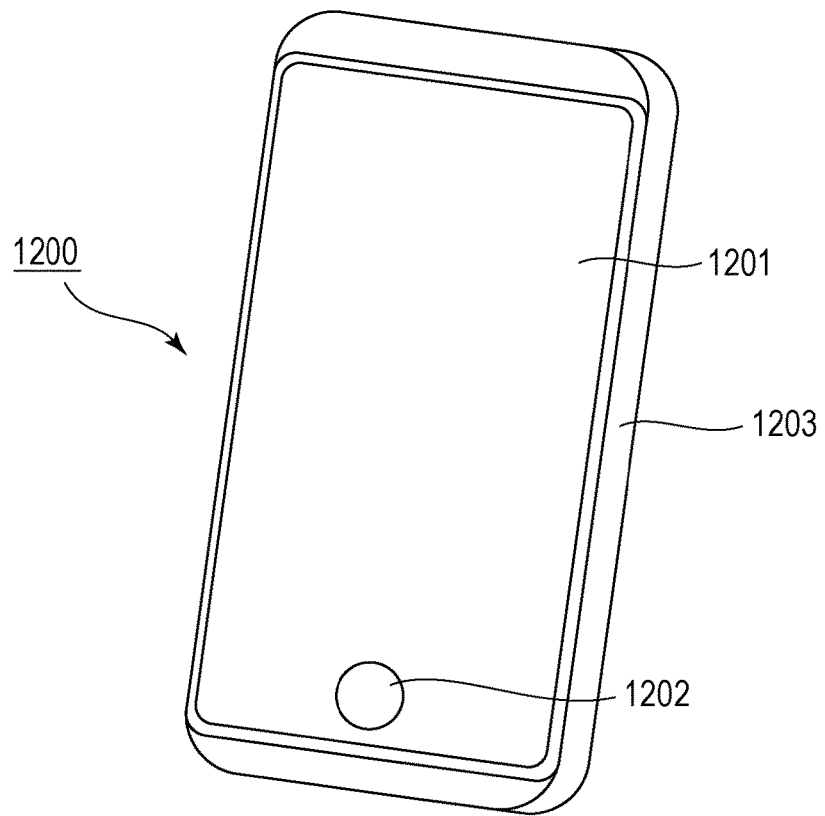
FIG. 10B is a schematic diagram illustrating an electronic apparatus according to an embodiment of the present disclosure.

FIG. 10B is a schematic diagram illustrating an example of the electronic apparatus according to this embodiment. The electronic apparatus 1200 includes a display 1201, an operating unit 1202, and a casing 1203. The casing 1203 may house a circuit, a printed board including the circuit, a battery, and a communication unit. The operating unit 1202 may be a button or a touch panel type reaction unit. The operating unit 1202 may be a living-organism recognition unit that recognizes fingerprints to release the lock. The electronic apparatus including the communication unit can also be referred to as a communication apparatus. The electronic apparatus may further have a camera function by including a lens and an image sensor. An image captured using the camera function is displayed on the display. Examples of the electronic apparatus include a smartphone and a notebook personal computer (PC).

Figure 11A:
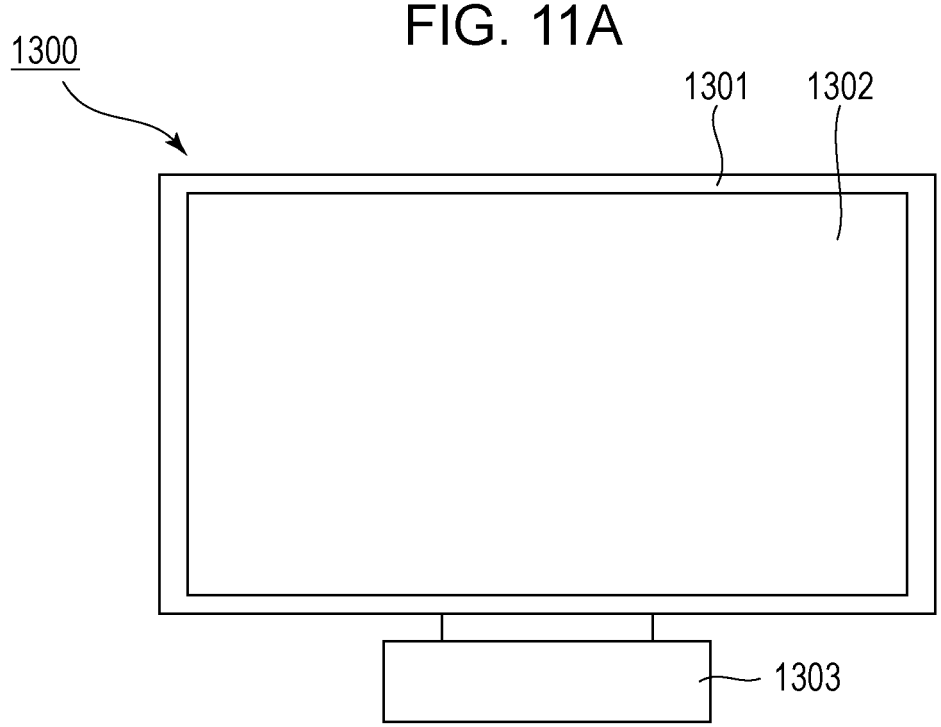
FIG. 11A is a schematic diagram illustrating a display apparatus according to an embodiment of the present disclosure.
Figure 11B:
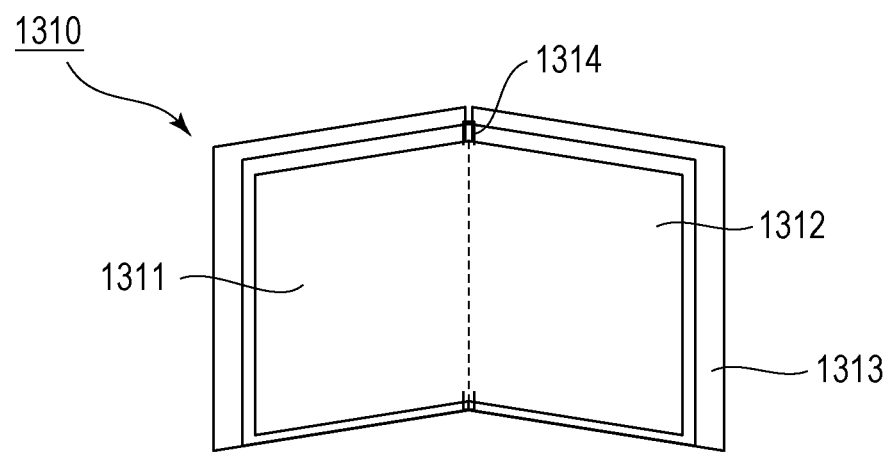
FIG. 11B is a schematic diagram illustrating a foldable display apparatus according to an embodiment of the present disclosure.

FIGS. 11A and 11B are schematic diagrams illustrating examples of the display apparatus according to this embodiment. FIG. 11A illustrates a display apparatus, such as a television monitor or a PC monitor. The display apparatus 1300 includes a frame 1301 and a display 1302. The display 1302 may include the light emitting apparatus according to this embodiment.

The display apparatus 1300 includes a base 1303 that supports the frame 1301 and the display 1302. The shape of the base 1303 is not limited to the shape shown in FIG. 11A. The lower side of the frame 1301 may serve as the base.

The frame 1301 and the display 1302 may be curved. The radius of curvature may be 5,000 mm or more and 6,000 mm or less.

FIG. 11B is a schematic diagram illustrating another example of the display apparatus according to this embodiment. A display apparatus 1310 in FIG. 11B is a foldable display apparatus whose display surface is foldable. The display apparatus 1310 includes a first display 1311, a second display 1312, a casing 1313, and a folding point 1314. The first display 1311 and the second display 1312 may each have the light emitting apparatus according to this embodiment. The first display 1311 and the second display 1312 may be one seamless display apparatus. The first display 1311 and the second display 1312 can be divided by the folding point. The first display 1311 and the second display 1312 may display different images or display one image with the first and the second display.

Figure 12A:
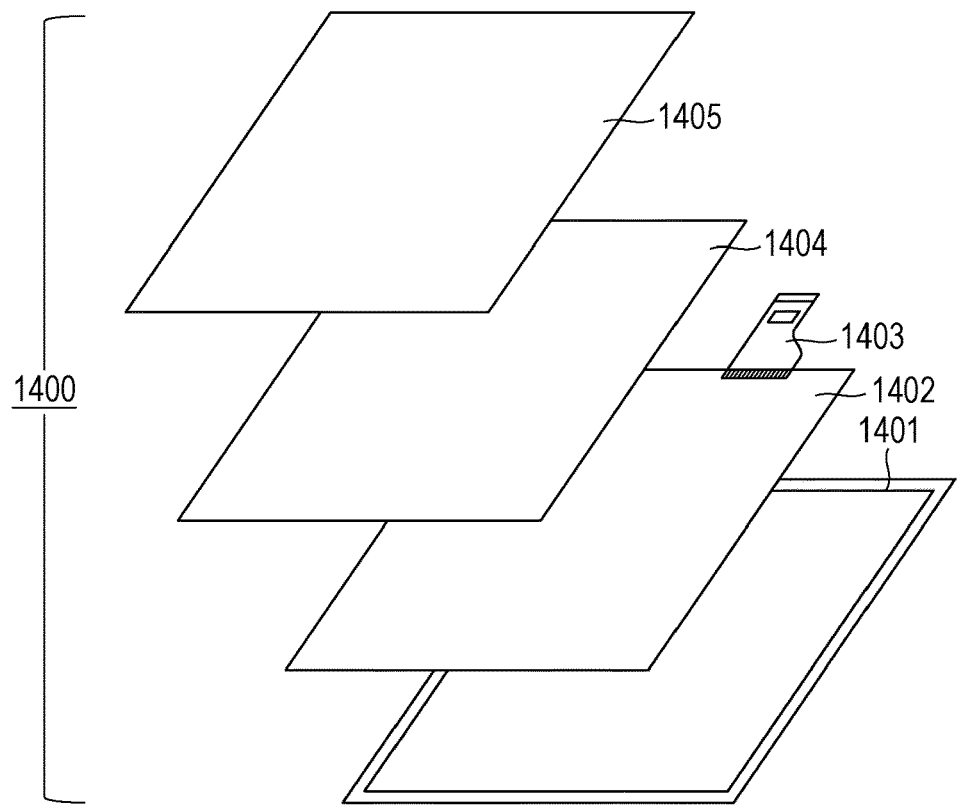
FIG. 12A is a schematic diagram illustrating an illumination system according to an embodiment of the present disclosure.

FIG. 12A is a schematic diagram illustrating an example of an illumination system according to this embodiment. The illumination system 1400 may include a casing 1401, a light source 1402, a circuit board 1403, an optical filter 1404, and a light diffusing unit 1405. The light source 1402 may include the organic light emitting element according to this embodiment. The optical filter 1404 may be a filter that increases the color rendering property of the light source 1402. The light diffusing unit 1405 can diffuse the light from the light source 1402 efficiently, for example, light up to deliver the light to a wide area. The optical filter 1404 and the light diffusing unit 1405 may be disposed on the light emission side. A cover may be provided on the periphery as needed.

An example of the illumination system is a device that illuminates the room. The illumination system 1400 may emit any of white, natural white, and blue to red light. The illumination system 1400 may include a dimmer circuit that controls the light.

The illumination system 1400 may include the organic light emitting element according to an embodiment of the present disclosure and a power circuit connected thereto. The power circuit converts alternating-current voltage to direct-current voltage. The white light has a color temperature of 4,200 K. The natural white light has a color temperature of 5,000 K. The illumination system 1400 may include color filters.

The illumination system 1400 according to this embodiment may include a heat radiator. The heat radiator releases the heat in the apparatus to the outside. Examples include metal and liquid silicon with high specific heat.

Figure 12B:
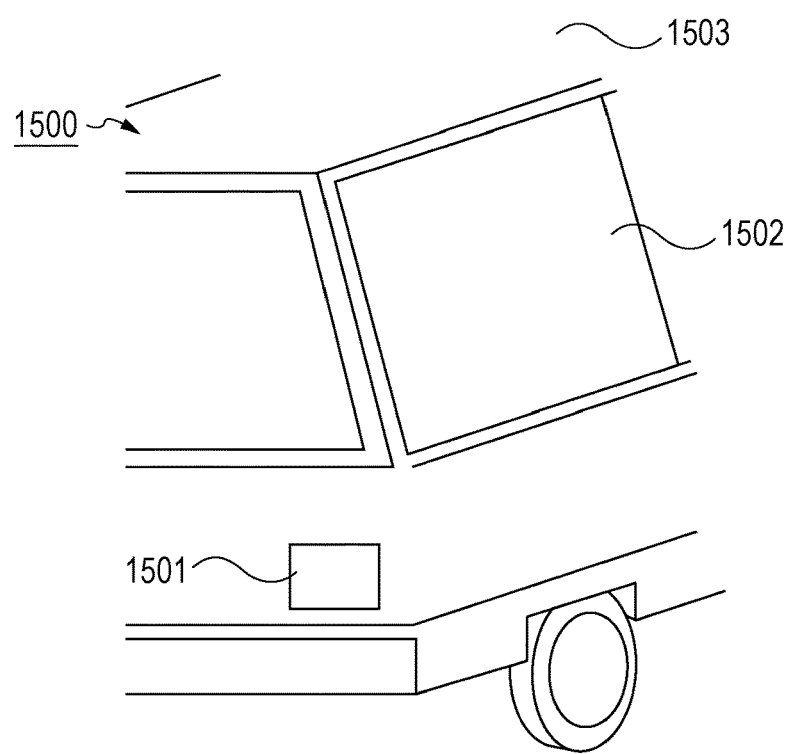
FIG. 12B is a schematic diagram of a moving object according to an embodiment of the present disclosure.

FIG. 12B is a schematic diagram of an automobile, which is an example of a moving object according to this embodiment. The automobile includes a tail lamp, which is an example of lighting fixtures. The automobile 1500 includes a tail lamp 1501 and may be configured to light on the tail lamp 1501 at a brake operation or the like.

The tail lamp 1501 may include the organic light emitting element according to this embodiment. The tail lamp 1501 may include a protector that protects the organic EL elements. The protector may be made of any transparent material with relatively high strength, such as polycarbonate. The polycarbonate may be mixed with a furandicarboxylic acid derivative, an acrylonitrile derivative, or the like.

The automobile 1500 may include a body 1503 and windows 1502 mounted thereto. The windows 1502 may include a transparent display if it is not a window for checking the front and back of the automobile 1500. The transparent display may include the organic light emitting element according to this embodiment. In this case, the components of the organic light emitting element, such as electrodes, are made of transparent materials.

The moving object according to this embodiment may be a ship, an aircraft, a drone, or the like. The moving object may include a body and a lighting fixture provided on the body. The lighting fixture may emit light for indicating the position of the body. The lighting fixture includes the organic light emitting element according to this embodiment.

Figure 13A:
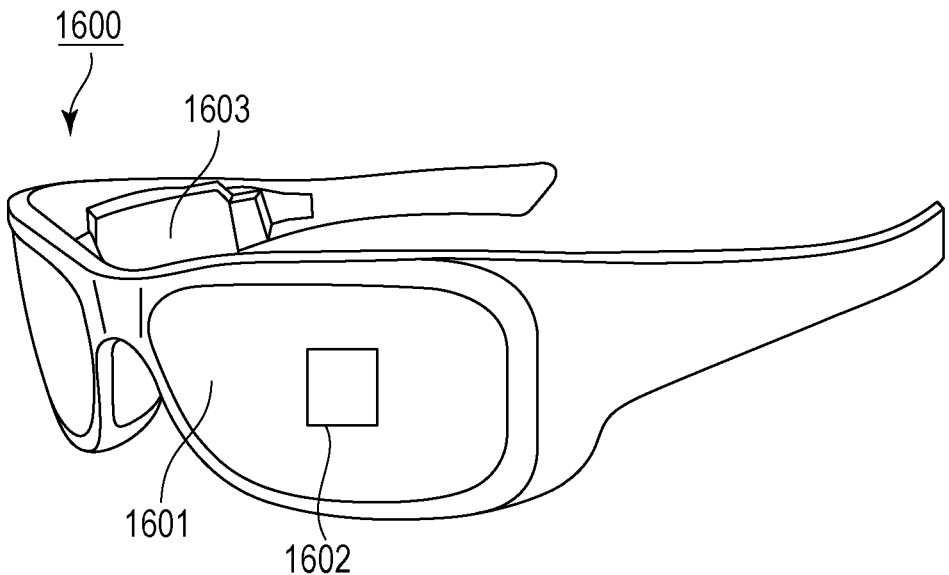
FIG. 13A is a schematic diagram illustrating a wearable device according to an application according to an embodiment of the present disclosure.
Figure 13B:
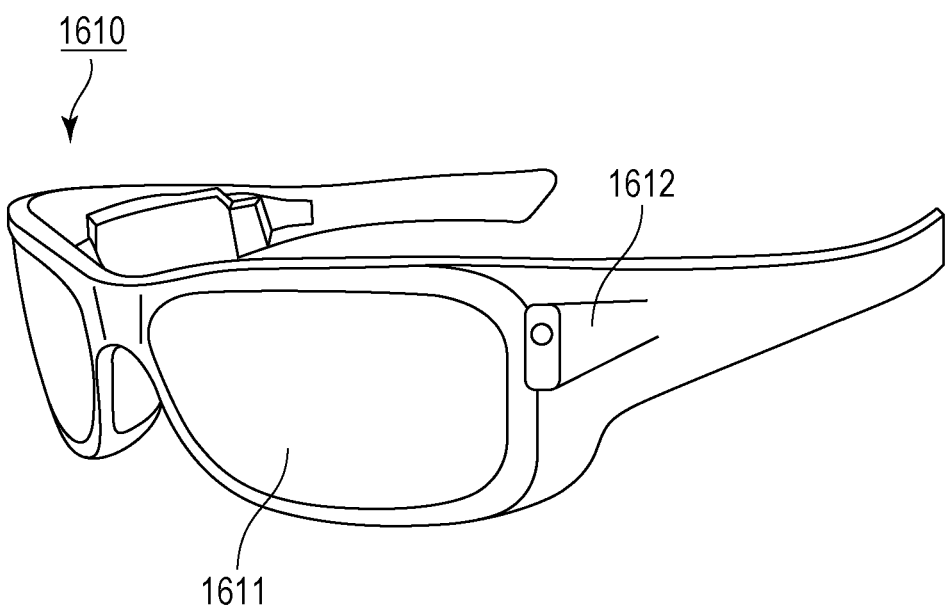
FIG. 13B is a schematic diagram illustrating a wearable device including an image capturing apparatus according to an application according to an embodiment of the present disclosure.

FIGS. 13A and 13B are schematic diagrams of spectacle display apparatuses, which are examples of a wearable device incorporating the light emitting apparatus according to an embodiment of the present disclosure. The display apparatuses are applicable to wearable devices, such as smartglasses, head-mounted displays (HMDs), and smart contact lenses. An image-capturing display apparatus used in such application examples includes an image capturing apparatus capable of photoelectrically converting visible light and a display apparatus capable of emitting visible light.

FIG. 13A illustrates a pair of glasses 1600 (smartglasses) according to an application. The pair of glasses 1600 includes an image capturing apparatus 1602, such as a complementary metal-oxide semiconductor (CMOS) sensor or a single photon avalanche diode (SPAD), on the front surface of a lens 1601. The display apparatus of each embodiment is provided on the back of the lens 1601.

The pair of glasses 1600 further includes a control unit 1603. The control unit 1603 functions as a power source for supplying electricity to the image capturing apparatus 1602 and the display apparatus according to each embodiment. The control unit 1603 controls the operation of the image capturing apparatus 1602 and the display apparatus. The lens 1601 is provided with an optical system for collecting light to the image capturing apparatus 1602.

FIG. 13B illustrates a pair of glasses (smartglasses) 1610 according to an application. The pair of glasses 1610 includes a control unit 1612. The control unit 1612 is provided with an image capturing apparatus corresponding to the image capturing apparatus 1602 and a display apparatus. A lens 1611 is provided with an optical system for projecting the light from the image capturing apparatus in the control unit 1612 and the display apparatus, and an image is projected on the lens 1611. The control unit 1612 functions as a power source for supplying electricity to the image capturing apparatus and the display apparatus and controls the operation of the image capturing apparatus and the display apparatus. The control unit 1612 may include a gaze detection unit that detects the gaze of the wearer. The gaze detection may use infrared light. An infrared emission unit emits infrared light to the eyeball of a user who is looking at the displayed image. The image capturing unit including a light receiving element detects the reflected light of the infrared light from the eyeball, so that an image of the eyeball is obtained. A reducing unit that reduces light from the infrared emission unit to the display in plan view reduces a decrease in image quality.

The gaze of the user to the displayed image is detected from the image of the eyeball using infrared light. The gaze detection using an image of the eyeball may use any known technique. An example is an eye-gaze tracking method based on Purkinje images obtained by the reflection of illuminated light on the cornea.

More specifically, a gaze tracking process based on pupil center corneal reflection is performed. The gaze of the user is detected by calculating a gaze vector indicating the orientation (rotation angle) of the eyeball on the basis the image of the pupil contained in the image of the eyeball and Purkinje images using pupil center conical reflection.

A display apparatus according to an embodiment of the present disclosure may include an image capturing apparatus including a light receiving element and may control an image displayed on the display apparatus on the basis of user gaze information provided from the image capturing apparatus.

Specifically, the display apparatus determines a first view area that the user gazes and a second view area other than the first view area on the basis of the gaze information. The first view area and the second view area may be determined by the control unit of the display apparatus or may be received from an external control unit. The display resolution of the first view area in the display area of the display apparatus may be set higher than the display resolution of the second view area. In other words, the resolution of the second view area may be set lower than the resolution of the first view area.

The display area includes a first display area and a second display area different from the first display area. A higher priority area is determined from the first display area and the second display area on the basis of the gaze information. The first view area and the second view area may be determined by the control unit of the display apparatus or may be received from an external control unit. The resolution of a higher priority area may be set higher than the resolution of the area other than the higher priority area. In other words, the resolution of the lower priority area may be set low.

The determination of the first view area and the higher priority area may use artificial intelligence (AI). The AI may be a model configured to estimate the angle of the gaze and the distance to the object of the gaze from an image of the eyeball using the image of the eyeball and the direction in which the eyeball in the image gazes actually. The AI program may be installed in the display apparatus, the image capturing apparatus, or an external apparatus. If the AI program is installed in an external apparatus, the AI program is sent to the display apparatus via communication.

Display control based on visual recognition allows application to smartglasses that further includes an image capturing apparatus that captures an external image. Smartglasses can display captured external information in real time.

Figure 14:
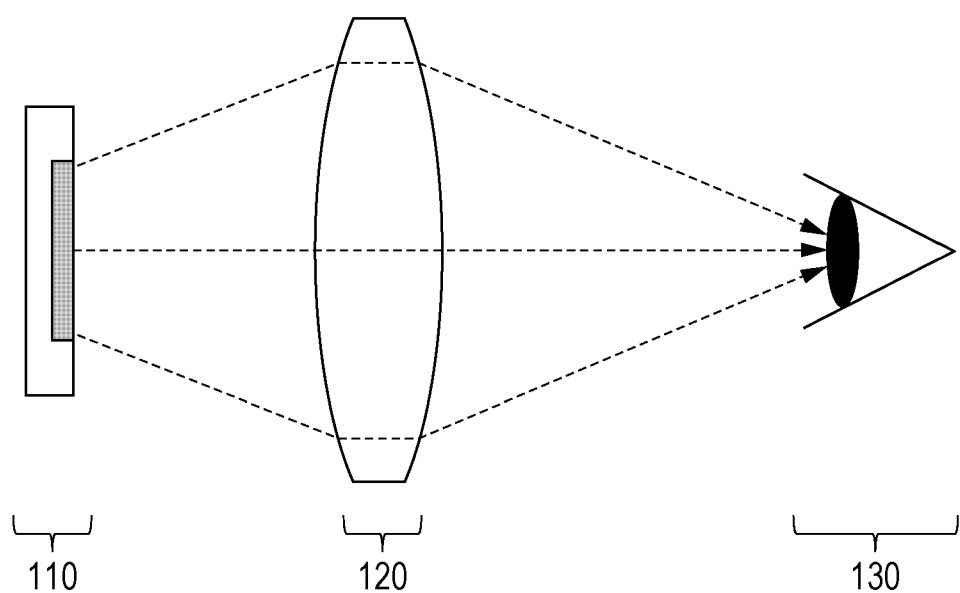
FIG. 14 is a diagram illustrating the positional relationship among the lens, the light emitting apparatus, and the viewer.

FIG. 14 is a diagram illustrating, in outline, light rays emitted from an organic light emitting apparatus to the user's eye in the case where the organic light emitting apparatus is used together with an optical system. When the organic light emitting apparatus 110 is used with an optical lens 120, as shown in FIG. 14, for the central area of the display area, the light rays directed to the front of the display surface are used. In contrast, for the peripheral area around the display area, the light rays directed obliquely with respect to the display surface are used to form an image on an eyeball 130.

Thus, the use of an apparatus including the organic light emitting element according to this embodiment allows stable display with high image quality even for long time display.

An embodiment of the present disclosure provides a light emitting apparatus using lenses in which reduction in color misregistration due to viewing angles is adjusted for each color.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-011299, filed Jan. 27, 2021, which is hereby incorporated by reference herein in its entirety.

What is claimed is:

1. An apparatus comprising:
a substrate including a surface;
a first element;
a second element;
a third element;
a fourth element, the first to fourth elements being disposed on the surface;
a first lens that receives light emitted from the first element;
a second lens that receives light emitted from the second element;
a third lens that receives light emitted from the third element; and
a fourth lens that receives light emitted from the fourth element,
wherein the first element and the second element emit first light, and the third element and the fourth element emit second light that differs in wavelength from the first light,
wherein, in a cross section perpendicular to the surface, a distance between a middle point of an emission area of the second element and an apex of the second lens in a direction parallel to the surface is larger than a distance between a middle point of an emission area of the first element and an apex of the first lens in the direction parallel to the surface,
wherein a distance between a middle point of an emission area of the fourth element and an apex of the fourth lens in the direction parallel to the surface is larger than a distance between a middle point of an emission area of the third element and an apex of the third lens in the direction parallel to the surface,
wherein a difference between the distance between the middle point of the emission area of the second element and the apex of the second lens in the direction parallel to the surface and the distance between the middle point of the emission area of the first element and the apex of the first lens in the direction parallel to the surface is equal to or less than a difference between the distance between the middle point of the emission area of the fourth element and the apex of the fourth lens in the direction parallel to the surface and the distance between the middle point of the emission area of the third element and the apex of the third lens in the direction parallel to the surface,
wherein the emission area of the second element is equal to or smaller than the emission area of the first element,
wherein the emission area of the fourth element is smaller than the emission area of the third element, and
wherein a difference in size between the emission area of the second element and the emission area of the first element is equal to or less than a difference in size between the emission area of the fourth element and the emission area of the third element.

2. The apparatus according to claim 1, wherein the emission area of the fourth element is smaller than the emission area of the second element.

3. The apparatus according to claim 1, wherein the emission area of the third element is smaller than the emission area of the first element.

4. The apparatus according to claim 1, wherein the emission area of the second element is equal in size to the emission area of the first element.

5. The apparatus according to claim 1, wherein the first light is shorter in wavelength than the second light.

6. The apparatus according to claim 1, wherein the first light is blue, and the second light is red or green.

7. The apparatus according to claim 1, wherein the distance between the middle point of the emission area of the second element and the apex of the second lens is equal to the distance between the middle point of the emission area of the fourth element and the apex of the fourth lens.

8. The apparatus according to claim 1, wherein the difference between the distance between the middle point of the emission area of the second element and the apex of the second lens in the direction parallel to the surface and the distance between the middle point of the emission area of the first element and the apex of the first lens in the direction parallel to the surface is equal to the difference between the distance between the middle point of the emission area of the fourth element and the apex of the fourth lens in the direction parallel to the surface and the distance between the middle point of the emission area of the third element and the apex of the third lens in the direction parallel to the surface.

9. The apparatus according to claim 1, further comprising:
a fifth element disposed between the first element and the second element and next to the second element; and
a fifth lens that receives light emitted from the fifth element,
wherein, in a cross section perpendicular to the surface, a distance between a middle point of an emission area of the fifth element and an apex of the fifth lens in the direction parallel to the surface is equal to the distance between the middle point of the emission area of the second element and the apex of the second lens in the direction parallel to the surface.

10. The apparatus according to claim 9, wherein a difference in size between the emission area of the fifth element and the emission area of the second element is smaller than a difference in size between the emission area of the second element and the emission area of the first element.

11. The apparatus according to claim 9, further comprising:
a sixth element next to the second element; and
a sixth lens that receives light emitted from the sixth element,
wherein the second element is disposed between the first element and the sixth element, and
wherein, in a cross section perpendicular to the surface, a distance between a middle point of an emission area of the sixth element and an apex of the sixth lens in the direction parallel to the surface is larger than the distance between the middle point of the emission area of the second element and the apex of the second lens in the direction parallel to the surface.

12. The apparatus according to claim 11, wherein the emission area of the sixth element is smaller than the emission area of the second element.

13. The apparatus according to claim 1, further comprising:
a seventh element disposed between the third element and the fourth element and next to the fourth element; and
a seventh lens that receives light emitted from the seventh element,
wherein, in a cross section perpendicular to the surface, a distance between a middle point of an emission area of the seventh element and an apex of the seventh lens in the direction parallel to the surface is equal to the distance between the middle point of the emission area of the fourth element and the apex of the fourth lens in the direction parallel to the surface.

14. The apparatus according to claim 13, wherein a difference in size between the emission area of the seventh element and the emission area of the fourth element is smaller than a difference in size between the emission area of the fourth element and the emission area of the third element.

15. The apparatus according to claim 13, further comprising:
an eighth element next to the fourth element; and
an eighth lens that receives light emitted from the eighth element,
wherein the fourth element is disposed between the third element and the eighth element, and
wherein, in a cross section perpendicular to the surface, a distance between a middle point of an emission area of the eighth element and an apex of the eighth lens in the direction parallel to the surface is larger than the distance between the middle point of the emission area of the fourth element and the apex of the fourth lens in the direction parallel to the surface.

16. The apparatus according to claim 15, wherein the emission area of the eighth element is smaller than the emission area of the fourth element.

17. The apparatus according to claim 1, further comprising:
a fifth element disposed between the first element and the second element and next to the second element; and
a fifth lens that receives light emitted from the fifth element,
wherein, in a cross section perpendicular to the surface, a distance between a middle point of an emission area of the fifth element and an apex of the fifth lens in the direction parallel to the surface is smaller than the distance between the middle point of the emission area of the second element and the apex of the second lens in the direction parallel to the surface, and
wherein, in a cross section perpendicular to the surface, the distance between the middle point of the emission area of the fifth element and the apex of the fifth lens in the direction parallel to the surface is larger than the distance between the middle point of the emission area of the first element and the apex of the first lens in the direction parallel to the surface.

18. The apparatus according to claim 17, wherein the emission area of the fifth element is larger than the emission area of the second element and smaller than the emission area of the first element.

19. The apparatus according to claim 17, further comprising:
a sixth element next to the second element; and
a sixth lens that receives light emitted from the sixth element,
wherein the second element is disposed between the first element and the sixth element, and
wherein, in a cross section perpendicular to the surface, a distance between a middle point of an emission area of the sixth element and an apex of the sixth lens in the direction parallel to the surface is larger than the distance between the middle point of the emission area of the second element and the apex of the second lens in the direction parallel to the surface.

20. The apparatus according to claim 19, wherein the emission area of the sixth element is smaller than the emission area of the second element.

21. The apparatus according to claim 17, further comprising:

a seventh element disposed between the third element and the fourth element and next to the fourth element; and a seventh lens that receives light emitted from the seventh element, wherein, in a cross section perpendicular to the surface, a distance between a middle point of an emission area of the seventh element and an apex of the seventh lens in the direction parallel to the surface is smaller than the distance between the middle point of the emission area of the fourth element and the apex of the fourth lens in the direction parallel to the surface, and wherein, in a cross section perpendicular to the surface, the distance between the middle point of the emission area of the seventh element and the apex of the seventh lens in the direction parallel to the surface is larger than the distance between the middle point of the emission area of the third element and the apex of the third lens in the direction parallel to the surface.

22. The apparatus according to claim 21, wherein the emission area of the seventh element is smaller than the emission area of the third element and larger than the emission area of the fourth element.

23. A display apparatus comprising:
a plurality of pixels,
wherein at least one of the plurality of pixels includes the apparatus according to claim 1 and a display control unit configured to control display of the apparatus.

24. An image capturing apparatus comprising:
an optical unit including a plurality of lenses;
a sensor that receives light passing through the optical unit; and
a display that displays an image captured by the sensor,
wherein the display includes the apparatus according to claim 1.

25. An electronic apparatus comprising:
a display including the apparatus according to claim 1;
a casing including the display; and
a communication unit disposed at the casing and communicating with outside.

26. An apparatus comprising:
a substrate including a surface;
a first element;
a second element, the first and second elements being disposed on the surface and emitting first color light;
a first lens that receives light emitted from the first element;
a second lens that receives light emitted from the second element;
a third element;
a fourth element, the third and fourth elements being disposed on the surface and emitting second color light different from the first color light;
a third lens that receives light emitted from the third element; and
a fourth lens that receives light emitted from the fourth element, wherein, in a direction parallel to the surface, a distance between a middle point of an emission area of the second element and an apex of the second lens is larger than a distance between a middle point of an emission area of the first element and an apex of the first lens, wherein, in the direction parallel to the surface, a distance between a middle point of an emission area of the fourth element and an apex of the fourth lens is larger than a distance between a middle point of an emission area of the third element and an apex of the third lens, wherein the distance between the middle point of the emission area of the second element and the apex of the second lens is equal to the distance between the middle point of the emission area of the fourth element and the apex of the fourth lens, wherein the emission area of the third element is larger than the emission area of the first element, and wherein the emission area of the fourth element is larger than the emission area of the second element.

* * * * *